(12) United States Patent
Yoo et al.

(10) Patent No.: US 11,989,381 B2
(45) Date of Patent: May 21, 2024

(54) DISPLAY DEVICE AND POSITION INPUT SYSTEM INCLUDING THE SAME

(71) Applicant: SAMSUNG DISPLAY CO., LTD., Yongin-si (KR)

(72) Inventors: Gi Na Yoo, Cheonan-si (KR); Ju Yeon Kim, Asan-si (KR); Won Sang Park, Yongin-si (KR); Chang Woo Shim, Cheonan-si (KR); Seong Jun Lee, Seoul (KR); Dong Hee Choi, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/935,338

(22) Filed: Sep. 26, 2022

(65) Prior Publication Data

US 2023/0266854 A1 Aug. 24, 2023

(30) Foreign Application Priority Data

Feb. 22, 2022 (KR) .......................... 10-2022-0022944

(51) Int. Cl.
*G06F 3/041* (2006.01)
*G06F 3/044* (2006.01)
*H10K 59/122* (2023.01)
*H10K 59/40* (2023.01)

(52) U.S. Cl.
CPC .......... *G06F 3/0448* (2019.05); *G06F 3/0412* (2013.01); *H10K 59/122* (2023.02); *H10K 59/40* (2023.02); *G06F 2203/04112* (2013.01)

(58) Field of Classification Search
CPC .... G06F 3/0317; G06F 3/0321; G06F 3/0425; G06F 3/03542; G06F 3/03545; G02F 1/13338
See application file for complete search history.

(56) References Cited

U.S. PATENT DOCUMENTS

| 2005/0162400 | A1* | 7/2005 | Tseng ................. G02F 1/13338 345/173 |
| 2014/0211103 | A1* | 7/2014 | Baek ..................... G06F 3/0421 349/110 |
| 2014/0267191 | A1* | 9/2014 | Takahara .............. G06F 3/0321 345/179 |
| 2014/0362054 | A1 | 12/2014 | Matsuki |
| 2016/0181332 | A1* | 6/2016 | Park .................... H01L 51/5271 257/88 |

(Continued)

FOREIGN PATENT DOCUMENTS

| KR | 10-2014-0088790 | 7/2014 |
| KR | 10-2014-0097638 | 8/2014 |

(Continued)

*Primary Examiner* — Yuzhen Shen
(74) *Attorney, Agent, or Firm* — CHAU & ASSOCIATES, LLC

(57) ABSTRACT

A display device includes subpixels on a substrate, position code patterns having a predetermined position code shape, when viewed in a plan view, each position code pattern being disposed at a region between at least two adjacent subpixels, and a pixel-defining layer defining a region where each subpixel is disposed and covering the position code patterns. The plurality of position code patterns are formed in a planar code shape and are configured to reflect light incident through the pixel-defining layer.

20 Claims, 20 Drawing Sheets

(56) References Cited

U.S. PATENT DOCUMENTS

| | | | |
|---|---|---|---|
| 2020/0373520 A1* | 11/2020 | Kim | H01L 51/5253 |
| 2020/0393936 A1* | 12/2020 | Bok | H01Q 1/44 |
| 2022/0165993 A1* | 5/2022 | Leng | H10K 50/865 |
| 2023/0023671 A1 | 1/2023 | Shim et al. | |
| 2023/0025419 A1 | 1/2023 | Yoo et al. | |

FOREIGN PATENT DOCUMENTS

| | | |
|---|---|---|
| KR | 10-2023-0016131 | 2/2023 |
| KR | 10-2023-0016737 | 2/2023 |

\* cited by examiner

DISPLAY DEVICE AND POSITION INPUT SYSTEM INCLUDING THE SAME

CROSS-REFERENCE TO RELATED APPLICATION

This application claims priority from Korean Patent Application No. 10-2022-0022944 filed on Feb. 22, 2022 in the Korean Intellectual Property Office, and all the benefits accruing therefrom under 35 U.S.C. 119, the contents of which in its entirety are herein incorporated by reference.

BACKGROUND

1. Field

The present disclosure relates to a display device and a position input system including the same.

2. Description of the Related Art

As the information society has developed, the demand for display devices for displaying images has diversified. For example, display devices have been applied to various electronic devices such as smart phones, digital cameras, notebook computers, navigation systems, and smart televisions. Examples of display devices include flat panel display devices such as a liquid crystal display (LCD) device, a field emission display (FED) device, and an organic light-emitting diode (OLED) display device. The OLED display device, in particular, includes light-emitting elements, which can allow pixels of a display panel to emit light, and can thus display an image without the aid of a backlight unit that provides light to the display panel.

Recent display devices support touch input made with parts of the human body (e.g., a finger) and touch input made with an electronic pen. Display devices can detect touch position input made with an electronic pen and can thus sense touch input more precisely than when being allowed to use only touch input made with part of the human body.

SUMMARY

Aspects of the present disclosure provide a display device capable of entering the position coordinates of a position input device such as an electronic pen with the use of code patterns of display panel and a touch input system including the display device.

Aspects of the present disclosure also provide a display device capable of generating position code patterns with the use of pixel electrode patterns during the formation of pixel electrodes of a display panel, without incurring any steps or costs, and a position input system including the display device.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a display device includes a plurality of subpixels on a substrate, a plurality of position code patterns having a predetermined position code shape, when viewed in a plan view, each position code pattern being disposed at a region between at least two adjacent subpixels among the plurality of subpixels, and a pixel-defining layer defining a region where each subpixel of the plurality of subpixels is disposed and covering the plurality of position code patterns. The plurality of position code patterns are formed in a planar code shape and are configured to reflect light incident through the pixel-defining layer.

In an embodiment, the plurality of subpixels include a plurality of red subpixels, a plurality of green subpixels, and a plurality of blue subpixels or include a plurality of red subpixels, a plurality of green subpixels, a plurality of blue subpixels, and a plurality of white subpixels. The plurality of subpixels are arranged in a vertical stripe configuration, a horizontal stripe configuration, or a Pentile™ matrix configuration.

In an embodiment, each subpixel of the plurality of subpixels includes a light-emitting element, which includes a pixel electrode, an emission layer, and a common electrode. The plurality of position code patterns and the plurality of pixel electrodes of the plurality of subpixels are formed of the same material.

In an embodiment, when viewed in a plan view, each position code pattern of the plurality of position code patterns is disposed between at least two adjacent pixel electrodes of the plurality of pixel electrodes and is separate from the plurality of pixel electrodes. The plurality of position code patterns and the plurality of pixel electrodes are disposed at the same height relative to the substrate. The plurality of position code patterns are electrically floating.

In an embodiment, the pixel-defining layer includes at least one transparent organic layer from among a photosensitive polyimide resin layer, a polyamide resin layer, a black pixel-defining layer, and a polyimide resin layer.

In an embodiment, each position code pattern of the position code patterns has a cross shape with two lines across each other. A portion of a line in the cross shape is disposed tween two adjacent subpixels of the plurality of subpixels. A crossing point of the two lines in the cross shape is disposed at a region surrounded by four adjacent subpixels of the plurality of subpixels.

In an embodiment, when viewed in a plan view, each position code pattern of the plurality of position code patterns has at least one polygonal shape from among a rectangular shape, a square shape, and a rhombus shape or a hybrid shape obtained by combining the at least one polygonal shape.

In an embodiment, when viewed in a plan view, each position code pattern of the plurality of position code patterns has at least one shape from among a fan shape, a semicircular shape, and a circular shape or a hybrid shape obtained by combining the at least one shape.

In an embodiment, when viewed in a plan view, each position code pattern of the plurality of position code patterns surrounds at least one subpixel among the plurality of subpixels, and each position code pattern of the plurality of position code patterns has at least one polygonal closed loop shape from among a rectangular closed loop shape, a rhombus closed loop shape, a hexagonal closed loop shape, and a hexagonal closed loop shape.

In an embodiment, when viewed in a plan view, each position code pattern of the position code patterns has a mesh shape surrounding at least two adjacent subpixels of the plurality of subpixels.

In an embodiment, when viewed in a plan view, each position code pattern of the plurality of position code patterns has an open loop shape partially surrounding a region where at least one subpixel of the plurality of subpixels is disposed, the open loop shape including a straight line or a curved line.

In an embodiment, when viewed in a plan view, the plurality of position code patterns have different sizes, different widths in at least one direction, different lengths in at least one direction, or different areas.

According to an embodiment of the disclosure, a position input system includes a display device displaying an image, and a position input device transmitting position coordinate data to the display device. The display device includes a plurality of subpixels on a substrate, a plurality of position code patterns having a predetermined position code shape, each position code pattern of the plurality of position code patterns, when viewed in a plan view, being disposed between at least two adjacent subpixels among the plurality of subpixels, and a pixel-defining layer covering the plurality of position code patterns and defining a region where each subpixel of the plurality of subpixels is disposed. The plurality of position code patterns are formed in a planar code shape and are configured to reflect light incident through the pixel-defining layer.

In an embodiment, each subpixel of the plurality of subpixels includes a light-emitting element including a pixel electrode, an emission layer, and a common electrode, and the plurality of position code patterns and the plurality of pixel electrodes of the plurality of subpixels are formed of the same material.

In an embodiment, when viewed in a plan view, each position code pattern of the plurality of position code patterns is disposed between at least two adjacent pixel electrodes of the plurality of pixel electrodes and is separate from the plurality of pixel electrodes. The plurality of position code patterns and the plurality of pixel electrodes are disposed at the same height relative to the substrate. The plurality of position code patterns are electrically floating.

In an embodiment, the pixel-defining layer includes at least one transparent organic layer from among a photosensitive polyimide resin layer, a polyamide resin layer, a black pixel-defining layer (PDL), and a polyimide resin layer.

In an embodiment, when viewed in a plan view, each position code pattern of the plurality of position code patterns has at least one polygonal shape from among a rectangular shape, a square shape, and a rhombus shape or a hybrid shape obtained by combining the at least one polygonal shape or has at least one shape from among a fan shape, a semicircular shape, and a circular shape or a hybrid shape obtained by combining the at least one shape.

In an embodiment, when viewed in a plan view, each position code pattern of the plurality of position code patterns surrounds at least one subpixel among the plurality of subpixels, and each position code pattern of the plurality of position code patterns has at least one polygonal closed loop shape from among a rectangular closed loop shape, a rhombus closed loop shape, a hexagonal closed loop shape, and a hexagonal closed loop shape or has in a mesh shape surrounding at least two adjacent subpixels of the plurality of subpixels.

In an embodiment, when viewed in a plan view, each position code pattern of the plurality of position code patterns has an open loop shape partially surrounding a region where at least one subpixel of the plurality of subpixels is disposed, the open loop shape including a straight line or a curved line. When viewed in the plan view, the plurality of position code patterns have different sizes, different widths in at least one direction, different lengths in at least one direction, or different areas.

In an embodiment, the position input device includes a code detector configured to sense the plurality of position code patterns, a code processor configured to receive shape data of the plurality of position code patterns, extract data codes corresponding to the shape of the plurality of position code patterns, and generate position coordinate data corresponding to the data codes, and a communication module configured to the position coordinate data to the display device.

Position code patterns can be formed using pixel electrode patterns during the formation of pixel electrodes of a display panel. Accordingly, the position code patterns can be formed in the display panel without incurring additional processes and costs.

The effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Embodiments of the present disclosure will hereinafter be described with reference to the accompanying drawings.

Figure 1:
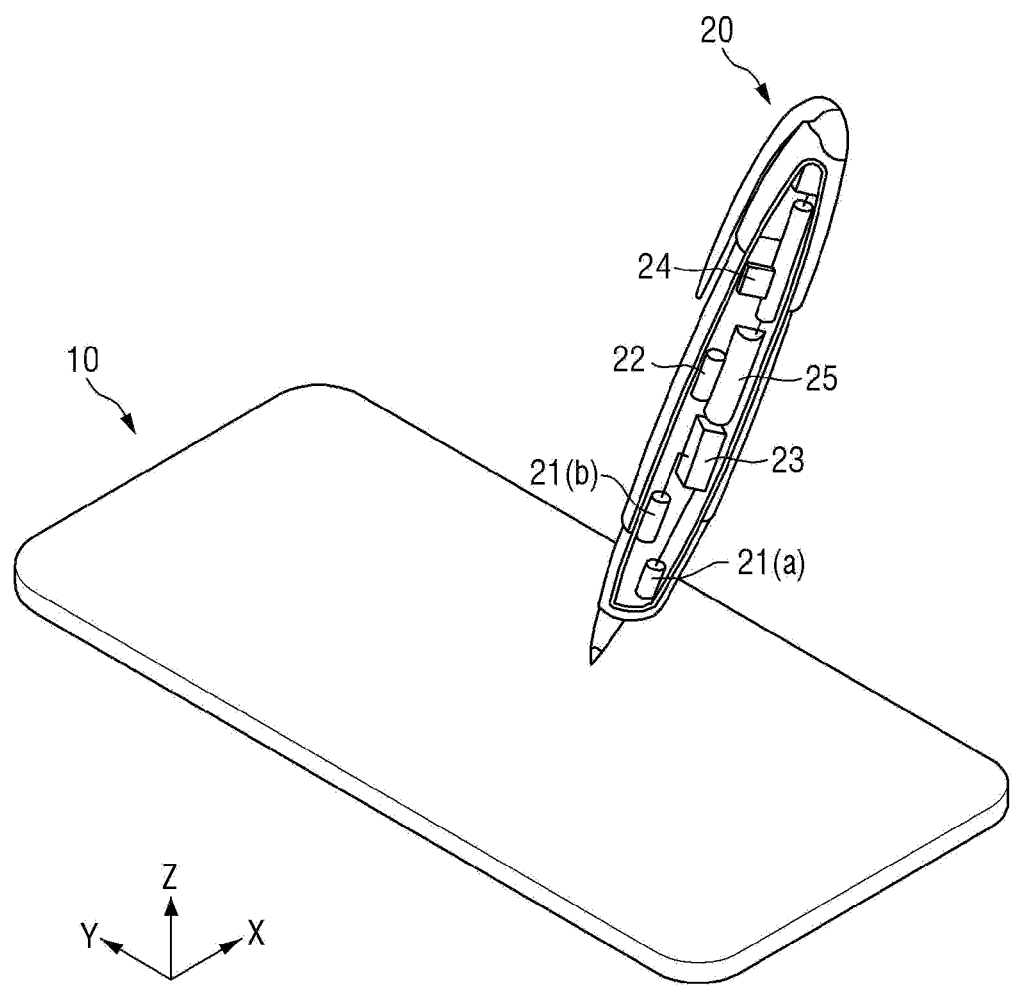
FIG. 1 is a perspective view of a position input system according to an embodiment of the present disclosure.
Figure 2:
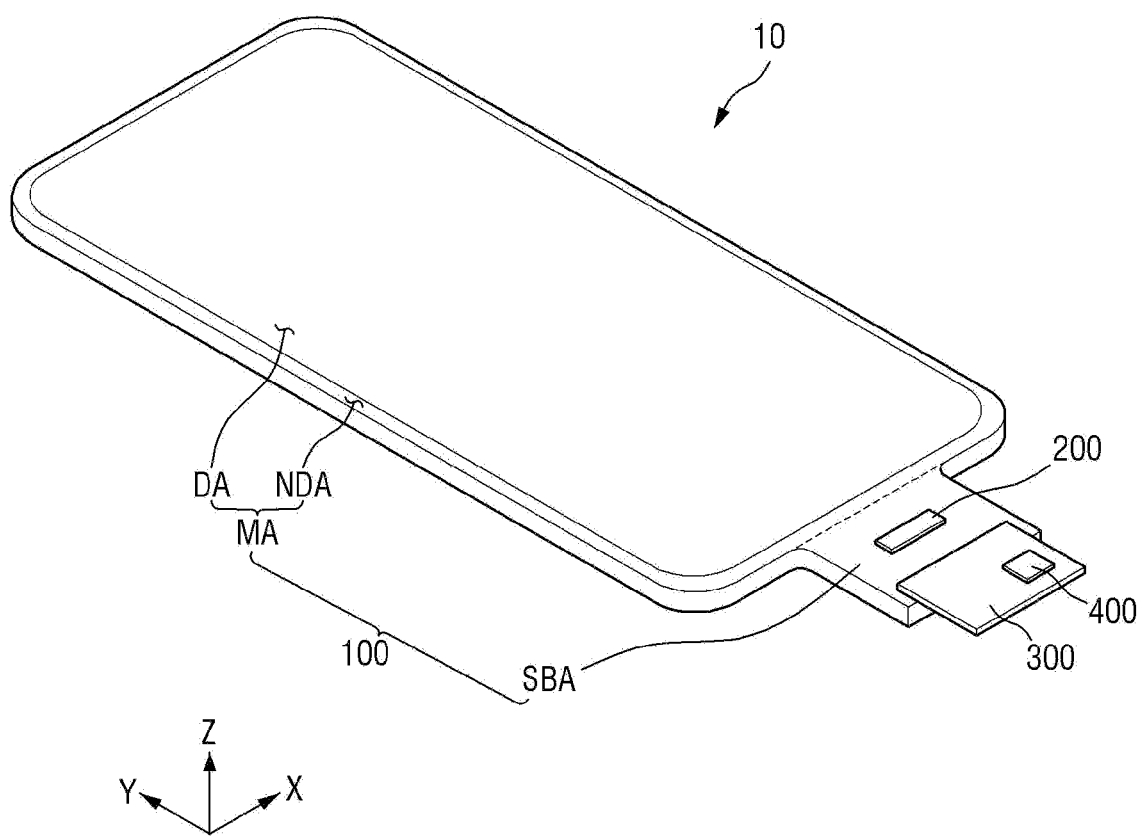
FIG. 2 is a perspective view of a display device of FIG. 1.

FIG. 1 is a schematic view of a touch input system according to an embodiment of the present disclosure. FIG. 2 is a perspective view of a display device of FIG. 1.

Referring to FIGS. 1 and 2, a display device 10 may be applicable to a portable electronic device such as a mobile phone, a smartphone, a tablet personal computer (PC), a mobile communication terminal, an electronic notepad, an electronic book (e-book), a portable multimedia player (PMP), a navigation device, and an ultra-mobile PC (UMPC). For example, the display device 10 may be used as the display unit of a television (TV), a laptop computer, a monitor, a billboard, or an Internet-of-Things (IoT) device. In an example, the display device 10 may be applicable to a wearable device such as a smartwatch, a watchphone, a glasses display, and a head-mounted display (HMD).

The display device 10 may be an organic light-emitting diode (OLED) display device using OLEDs, a quantum-dot light-emitting diode (LED) display device including a quantum-dot emission layer, an inorganic light-emitting display device including an inorganic semiconductor, or a micro- or nano-LED display device using micro- or nano-LEDs. For convenience, the display device 10 will hereinafter be described as being an OLED display device, but the present disclosure is not limited thereto.

The display device 10 includes a display panel 100, a display driving unit 200, a touch driving unit 400, a main processor 500, and a communication unit 600.

The display device 10 uses a position input device 20 such as an electronic pen as means for entering position coordinates. The display panel 100 of the display device 10 may include a display unit DU, which displays an image, and a touch sensing unit TSU, which detects touch input from, for example, a part of the body (e.g., a finger) or a touch pen.

The display unit DU of the display panel 100 may include a plurality of unit pixels and may display an image via the unit pixels. The touch sensing unit TSU may be mounted and attached to the front of the display panel 100. The touch sensing unit TSU may include a plurality of touch electrodes and may be able to detect touch input from, for example, a part of the body (e.g., a finger) or a touch pen, from the front of the display panel 100 in a capacitive manner.

Figure 3:
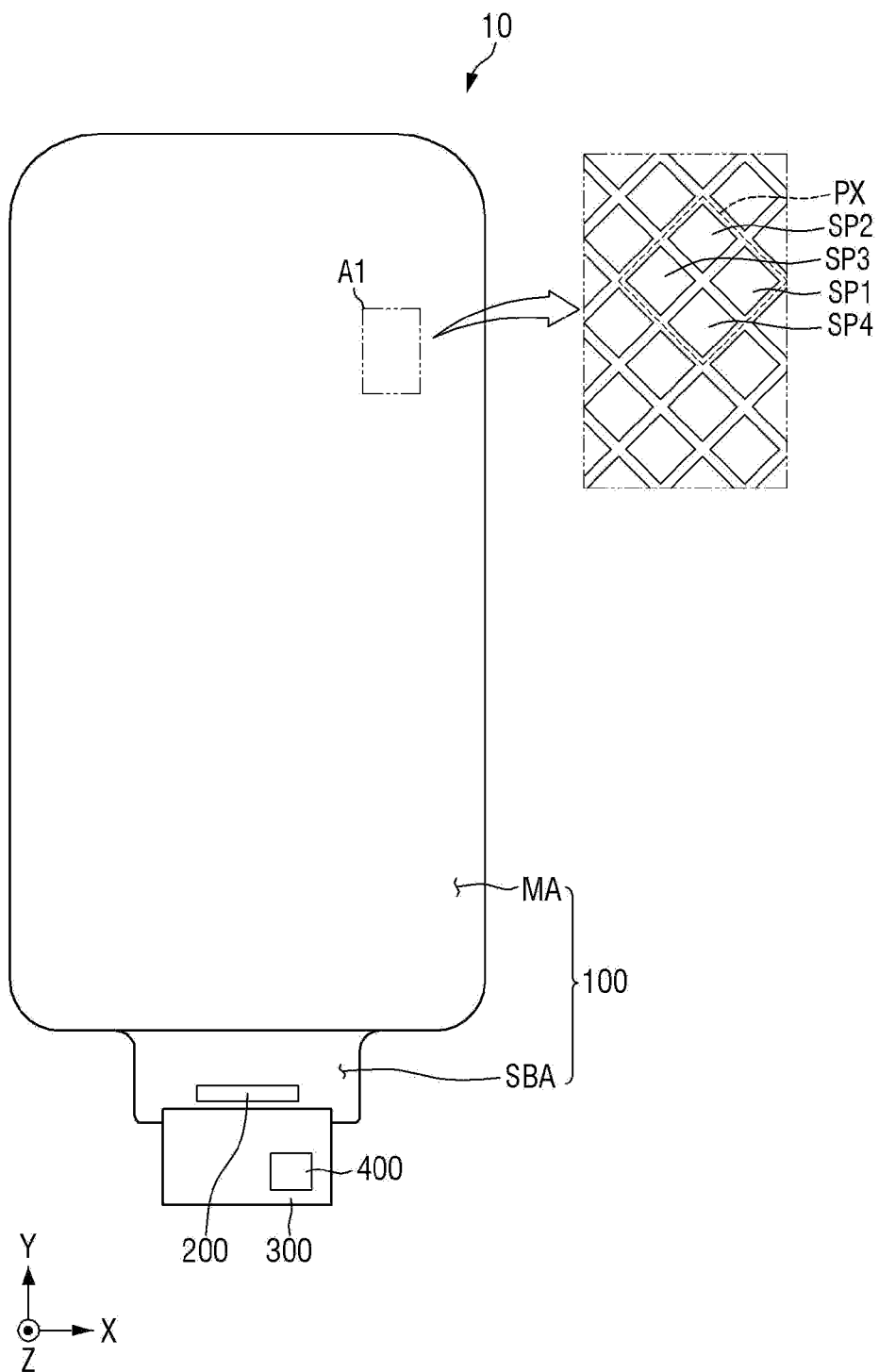
FIG. 3 is a plan view illustrating the display device of FIG. 1 and a pixel area of the display device.

FIG. 3 is a plan view illustrating the display device of FIG. 1 and a pixel area of the display device.

Referring to FIG. 3, the display panel 100 may be formed in a rectangular shape having short sides in a first direction (or an X-axis direction) and long sides in a second direction (or a Y-axis direction), which intersects the first direction (or the X-axis direction). The corners where the short sides and the long sides meet may be rounded with a predetermined curvature or may be right-angled. However, the shape of the display panel 100 is not particularly limited, and the display panel 100 may be formed in various other shapes such as a non-rectangular polygonal shape, a circular shape, and an elliptical shape. The display panel 100 may be formed to be flat, but the present disclosure is not limited thereto. In an embodiment, the display panel 100 may be provided with curved parts that are formed at both ends of the display panel 100 to have a uniform or varying curvature. The display panel 100 may be formed to be flexible. For example, the display panel 100 may be bendable, foldable, or rollable.

The display panel 100 may include a main area MA and a subarea SBA. The main area MA may include a display area DA, which displays an image, and a non-display area NDA, which is around the display area DA. The display area DA may include a plurality of unit pixels PX. The display area DA may emit light via the unit pixels PX and a plurality of opening areas (or emission areas) corresponding to the unit pixels PX. The display panel 100 may include pixel circuits including switching elements, a pixel-defining layer defining emission areas or opening areas, and self-light-emitting elements. The non-display area NDA may be an area outside the display area DA. The non-display area NDA may be defined as an edge part of the main area MA. The non-display area NDA may include a gate driving unit (not illustrated) providing gate signals to gate lines and fan-out lines (not illustrated) connecting the display driving unit 200 and the display area DA.

The subarea SBA may protrude in the second direction (or the Y-axis direction) from one side of the main area MA. The subarea SBA may be bendable. The subarea SBA may be bent to be positioned at the rear of the display panel 100. When bent in a direction toward the rear of the display panel 100, the subarea SBA may overlap the main area MA in a thickness direction, i.e., in a third direction (or a Z-axis direction).

In the display area DA of the display panel 100, the unit pixels PX may be arranged in the first and second directions (or the X- and Y-axis directions), and each of the unit pixels PX may include a plurality of subpixels SP, e.g., first, second, third, and fourth subpixels SP1, SP2, SP3, and SP4. Each of the unit pixels PX may display an image via the first, second, third, and fourth subpixels SP1, SP2, SP3, and SP4. The first, second, third, and fourth subpixels SP1, SP2, SP3, and SP4 may be arranged in a Pentile™ matrix configuration. In an embodiment, the first, second, third, and fourth subpixels SP1, SP2, SP3, and SP4 may be arranged in a vertical or horizontal stripe configuration. The display area DA where the unit pixels PX are arranged may account for most of the main area MA.

Figure 4:
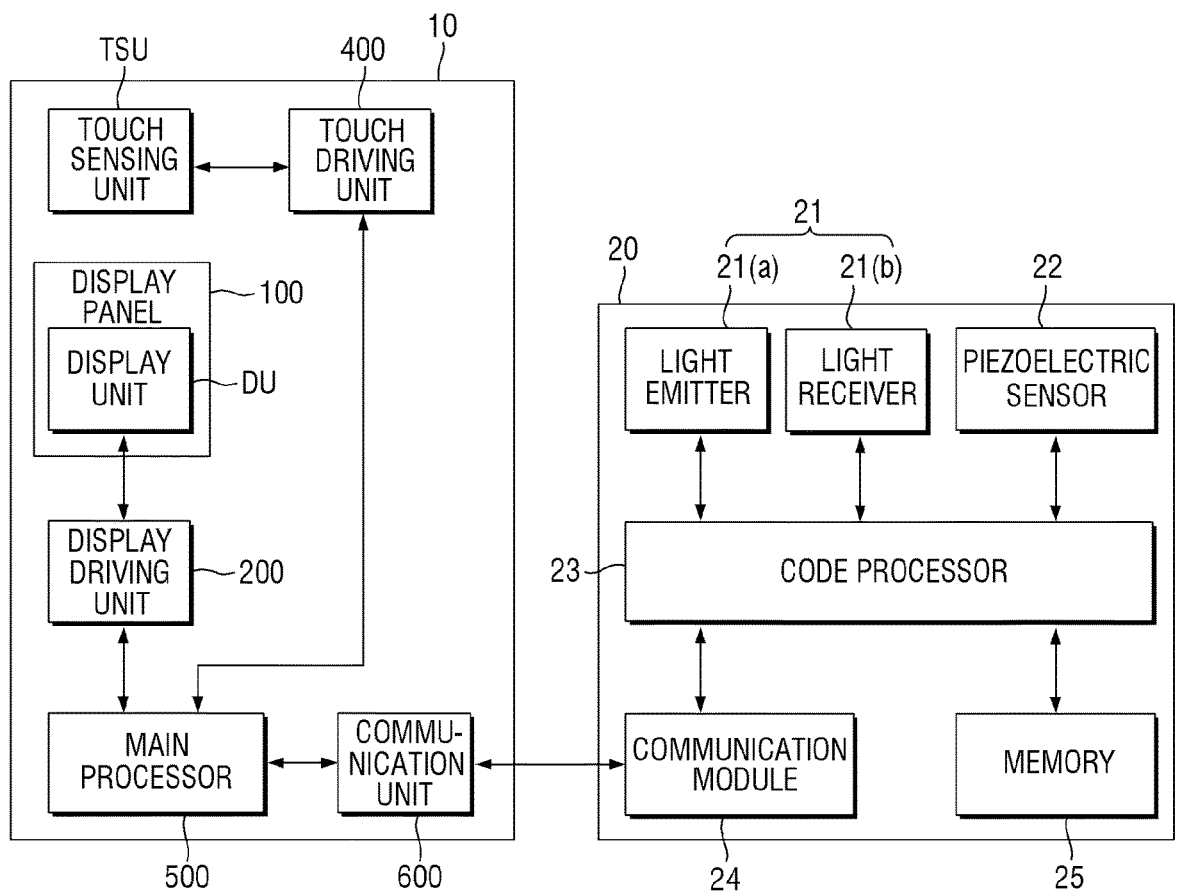
FIG. 4 is a block diagram illustrating a position input device and the display device of FIG. 1.

FIG. 4 is a block diagram illustrating the display device and the position input device of FIG. 1.

Referring to FIG. 4, the display driving unit 200 of the display device 10 may output signals and voltages for driving the display unit DU. The display driving unit 200 may provide data voltages to data lines. The display driving unit 200 may provide power supply voltages to power lines and may provide gate control signals to a gate driving unit (not illustrated).

The touch driving unit 400 may be connected to the touch sensing unit TSU. The touch driving unit 400 may provide touch driving signals to the touch electrodes and may sense capacitance variations between the touch electrodes. The touch driving unit 400 may calculate the presence and the coordinates of touch input from the user based on the capacitance variations between the touch electrodes.

The main processor 500 may control the functions of the display device 10. For example, the main processor 500 may provide digital video data to the display driving unit 200 so that the display panel 100 may display an image. The main processor 500 may receive touch data from the touch driving unit 400 to determine the coordinates of touch input from the user and may either generate digital video data corresponding to the touch coordinates of the touch input or execute an application corresponding to an icon displayed at the touch coordinates of the touch input.

The main processor 500 may receive position coordinate data from the position input device 20 and may determine the position coordinates of regions of the display area DA to which the position input device 20 is directed based on the position coordinate data. The main processor 500 may generate digital video data corresponding to the position coordinates of the position input device 20 or an application corresponding to an icon displayed at the position coordinates of a region pointed by the position input device 20.

The communication unit 600 may communicate with an external device in a wired or wireless manner. For example, the communication unit 600 may transmit communication signals to, or receive communication signals from, the communication module 24 of the position input device 20. The communication unit 600 may receive position coordinate data from the position input device 20 and may provide the position coordinate data to the main processor 500. In an embodiment, the position coordinate data may be generated by obtaining data codes from position code patterns on the display area DA and combining the data codes. In an embodiment, the position coordinate data may be consisted of the data codes obtained from the position code patterns.

The position input device 20 may be positioned at the front of the display panel 100 when in use by a user. The position input device 20 detects position coordinates at the front of the display panel 100 by recognizing position code patterns of the display panel 100 at the front of the display panel 100. Specifically, the position input device 20, which is an electronic pen capable of sensing light reflected from the position code patterns of the display panel 100 in an optical manner, may detect the position code patterns based on the reflected light and may generate position coordinate data. The position input device 20 may be an electronic pen such as a smart pen, but the present disclosure is not limited thereto.

The position input device 20 includes a code detector 21, a piezoelectric sensor 22, a code processor 23, a communication module 24, and a memory 25.

The code detector 21 of the position input device 20 is disposed near the nib part of the smart pen 20 and detects position code patterns included in the display panel 100 of the display device 10. Specifically, the code detector 21 may include a light emitter 21(a), which emits infrared (IR) light via at least one IR light source, and a light receiver 21(b), which detects, with the use of an IR camera, IR light reflected from the position code patterns of the display panel 100.

The IR light source of the light emitter 21(a) may be implemented as an array of IR light-emitting diodes (LEDs) that are arranged in a matrix. The IR camera of the light receiver 21(b) may include a filter capable of transmitting IR light therethrough while blocking other wavelength ranges, a lens system for focusing IR light transmitted through the filter, and an optical image sensor for converting an optical image formed by the lens system into an electric image signal. The optical image sensor may be implemented as an array of image sensors that are arranged in a matrix and may provide shape data of position code patterns of the display unit DU based on IR light reflected from the position code patterns. The code detector 21 of the position input device 20 may continuously or periodically detect position code patterns included in the display unit DU, under the control of the user, in accordance with the motion of the user, may continuously generate shape data of the position code patterns, and may provide the shape data to the code processor 23.

The code processor 23 may continuously or periodically receive shape data of the position code patterns from the code detector 21. For example, the code processor 23 may continuously or periodically receive shape data regarding the position code patterns and may identify the layout and the shape of the position code patterns. The code processor 23 may extract or generate data codes corresponding to the layout and the shape of the position code patterns, may combine the data codes, and may extract or generate position coordinate data corresponding to the result of the combination. The code processor 23 may transmit the position coordinate data to the display device 10 via the communication module 24. The code processor 23 may generate the position coordinate data without performing complicated computations and correction processes, by receiving the shape data of the position code patterns and generating data codes corresponding to the position code patterns.

The communication module 24 may communicate with an external device in a wired or wireless manner. For example, the communication module 24 may transmit communication signals to, or receive communication signals from, the communication unit 600 of the display device 10. The communication module 24 may receive the position coordinate data from the code processor 23 and may provide the position coordinate data to the communication unit 600.

The memory 25 may store data necessary for driving the position input device 20. Shape data for position code patterns and data codes corresponding to the shape data and the position code patterns are stored in the memory 25. Also, data codes and position coordinate data for combinations of the data codes are stored in the memory 25. In an embodiment, the memory 25 may store shape data of position code patterns, data codes corresponding to the shape data and the position code patterns, and position coordinate data corresponding to combinations of the data codes. The memory 25 may shares the data codes and the position coordinate data with the code processor 23. Accordingly, the code processor 23 may combine data codes based on the data codes and the position coordinate data stored in the memory 25 and may extract or generate position coordinate data corresponding to the result of the combination.

Figure 5:
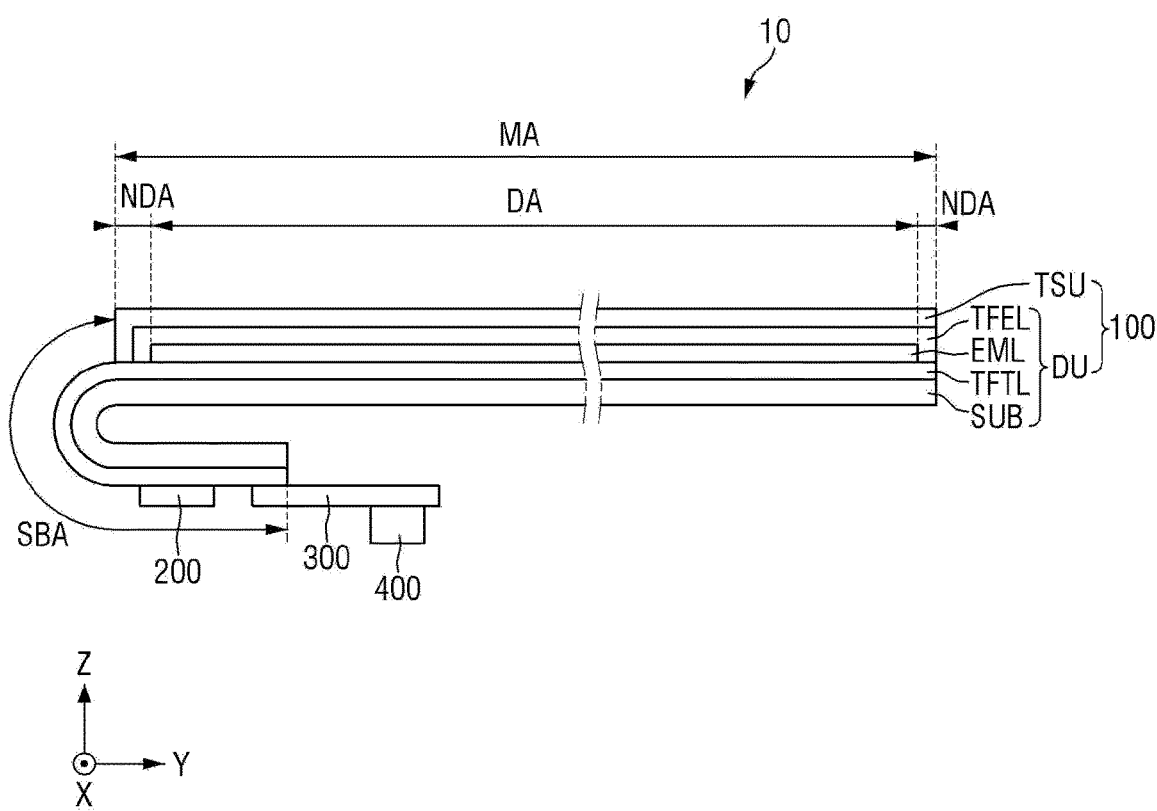
FIG. 5 is a cross-sectional view of the display device of FIG. 1.

FIG. 5 is a cross-sectional view of the display device of FIG. 1.

Referring to FIG. 5, The substrate SUB may be a base substrate or a base member. The substrate SUB may be a flexible substrate that is bendable, foldable, or rollable. For example, the substrate SUB may include a glass material or a metallic material, but the present disclosure is not limited thereto. In an example, the substrate SUB may include or may be formed of a polymer resin such as polyimide (PI).

A thin-film transistor (TFT) layer TFTL may be disposed on the substrate SUB. The TFT layer TFTL may include a plurality of TFTs that form the pixel circuits of pixels. The TFT layer TFTL may gate lines, data lines, power supply lines, gate control lines, and fan-out lines, which connect the display driving unit 200 and the data lines, and lead lines, which connect the display driving unit 200 to a pad unit. In a case where the gate driving unit is formed on one side of the non-display area NDA of the display panel 100, the gate driving unit may include TFTs.

The TFT layer TFTL may be disposed in the display area DA, the non-display area NDA, and the subarea SBA. The TFTs, the gate lines, the data lines, and the power supply lines of the TFT layer TFTL may be disposed in the display area DA. The gate control lines and the fan-out lines of the TFT layer TFTL may be disposed in the non-display area NDA. The lead lines of the TFT layer TFTL may be disposed in the subarea SBA.

A light-emitting element layer EML may be disposed on the TFT layer TFTL. The light-emitting element layer EML may include a plurality of light-emitting elements, in which first electrodes, emission layers, and second electrodes are sequentially stacked to emit light, and a pixel-defining layer, which defines subpixels. The light-emitting elements of the light-emitting element layer EML may be disposed in the display area DA. The emission layers may be organic emission layers including an organic material. The emission layers may include hole transport layers, organic emission layers, and electron transport layers. As the first electrodes receive a predetermined voltage via the TFTs of the TFT layer TFTL and the second electrodes receive a cathode voltage, holes and electrons may move to the emission layers through the hole transport layer and the electron transport layers and may be combined together in the emission layers to emit light. For example, each of the first electrodes may be, but is not limited to, an anode electrode that may be used as a pixel electrode, and each of the second electrodes may be, but is not limited to, a cathode electrode that may be used as a common electrode. In an example, the light-emitting elements of the light-emitting element layer EML may include QLEDs including quantum-dot emission layers or ILEDs including an inorganic semiconductor.

Position code patterns may be disposed in the same layer as pixel electrodes that are used as the anode electrodes of the light-emitting element layer EML, i.e., the pixel electrodes of the subpixels SP. The position code patterns and the pixel electrodes may be formed of the same material in the same process, and each of the position code patterns may be formed in an area where the pixel-defining layer is to be formed, between the pixel electrodes, to be separate from the pixel electrodes. The pixel-defining layer may be formed to cover the position code patterns. Specifically, the position code patterns and the pixel electrodes may be formed of the same material at the same time by a patterning process for forming the pixel electrodes and may thus be positioned in the same layer. For example, the position code patterns and the pixel electrodes may be formed from a same layer by a patterning process for forming the pixel electrodes to be separate from each other. The position code patterns and the pixel electrodes may be formed of the same material and may be disposed at the same height relative to a substrate SUB (see, FIGS. 9 and 10). The pixel electrodes may be formed to correspond to their respective subpixels SP. On the contrary, the position code patterns may be formed in the area where the pixel-defining layer is to be formed, between the subpixels, to be separate from the pixel electrodes.

Each of the position code patterns may be formed in a predetermined position code area in the form of a predetermined pattern. Each of the position code patterns may be formed between subpixel areas corresponding to a predetermined position code area, in a predetermined planar pattern shape. The position code patterns may have a polygonal shape such as a rectangular shape, a square shape, a fan shape, a semicircular shape, a circular shape, a rhombus shape, and a cross shape. In an embodiment, each position code pattern of the position code patterns may have a cross shape with two lines across each other. A portion of a line in the cross shape is disposed tween two adjacent subpixels of a plurality of subpixels. A crossing point of the two lines in the cross shape is disposed at a region surrounded by four adjacent subpixels of the plurality of subpixels. In an embodiment, the position code patterns may have a closed loop shape or a mesh shape surrounding at least one subpixel SP or may have an open loop shape surrounding only part of at least one subpixel SP. In an embodiment, the position code patterns may have a rectilinear or curved-line shape or an irregular polygonal shape with a predetermined curvature.

The encapsulation layer TFEL may cover the top surface and the side surfaces of the light-emitting element layer EML and may protect the light-emitting element layer EML. The encapsulation layer TFEL may include at least one inorganic layer and at least one organic layer for encapsulating the light-emitting element layer EML.

The touch sensing unit TSU may be disposed on the encapsulation layer TFEL. The touch sensing unit TSU may include a plurality of touch electrodes for detecting touch input from a user in a capacitive manner and touch lines for connecting the touch electrodes and the touch driving unit 400. For example, the touch sensing unit TSU may detect touch input from the user in a self-capacitive manner or a mutual capacitance manner. In an embodiment, the touch sensing unit TSU may be disposed on a separate substrate disposed on the display unit DU. In this case, the substrate that supports the touch sensing unit TSU may be a base member that encapsulates the display unit DU.

The touch electrodes of the touch sensing unit TSU may be disposed in a touch sensor area that overlaps the display area DA. The touch lines of the touch sensing unit TSU may be disposed in a touch peripheral area that overlaps the non-display area NDA.

The subarea SBA may extend from one side of the main area MA. The subarea SBA may include a flexible material that is bendable, foldable, or rollable. For example, as the subarea SBA is bent, the subarea SBA may overlap the main area MA in the Z-axis direction. The subarea SBA may include the display driving unit 200 and the pad unit, which is connected to the circuit board 300.

Figure 6:
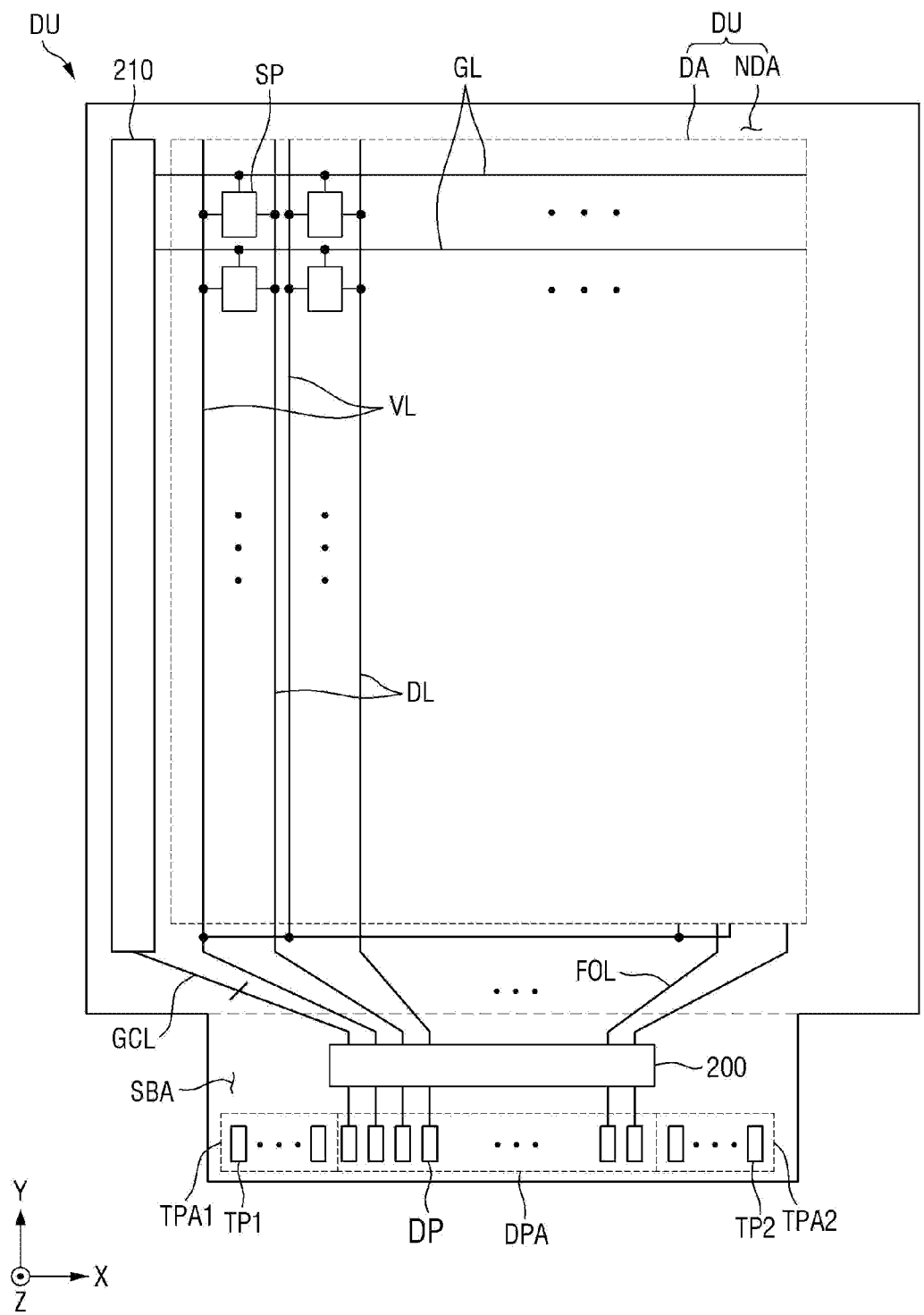
FIG. 6 is a plan view of a display unit of the display device of FIG. 1.

FIG. 6 is a plan view of the display unit of the display device of FIG. 1.

Referring to FIG. 6, the display area DA of the display unit DU, which is an area that displays an image, may be defined as a central part of the display panel 100. The display area DA may include a plurality of subpixels SP, a plurality of gate lines GL, a plurality of data lines DL, and a plurality of power supply lines VL. The pixels SP may be defined as units for outputting light.

The gate lines GL may provide gate signals from a gate driving unit 210 to the subpixels SP. The gate lines GL may extend in the X-axis direction and may be spaced apart from one another in the Y-axis direction, which intersects the X-axis direction.

The data lines DL may provide data voltages from the display driving unit 200 to the subpixels SP. The data lines DL may extend in the Y-axis direction and may be spaced apart from one another in the X-axis direction.

The power supply lines VL may provide power supply voltages from the display driving unit 200 to the subpixels SP. Here, the power supply voltages may include at least one of a driving voltage, an initialization voltage, and a reference voltage. The power supply lines VL may extend in the Y-axis direction and may be spaced apart from one another in the X-axis direction.

The non-display area NDA of the display unit DU may surround the display area DA. The non-display area NDA may include the gate driving unit 210, fan-out lines FOL, and gate control lines GCL. The gate driving unit 210 may generate a plurality of gate signals based on gate control signals and may sequentially provide the gate signals to the gate lines GL in a predefined order.

The fan-out lines FOL may extend from the display driving unit 200 to the display area DA. The fan-out lines FOL may provide data voltages from the display driving unit 200 to the data lines DL.

The gate control lines GCL may extend from the display driving unit 200 to the gate driving unit 210. The gate control lines GCL may provide the gate control signals from the display driving unit 200 to the gate driving unit 210.

The subarea SBA may include the display driving unit 200, a display pad area DPA, and first and second touch pad areas TPA1 and TPA2.

The display driving unit 200 may output signals and voltages for driving the display panel 100 to the fan-out lines FOL. The display driving unit 200 may provide data voltages to the data lines DL through the fan-out lines FOL. The data voltages may be provided to the subpixels SP and may determine the luminance of the subpixels SP. The display driving unit 200 may provide the gate control signals to the gate driving unit 210 through the gate control lines GCL.

The display pad area DPA, the first touch pad area TPA1, and the second touch pad area TPA2 may be disposed along an edge of the subarea SBA. The display pad area DPA, the first touch pad area TPA1, and the second touch pad area TPA2 may be electrically connected to the circuit board 300 via a low-resistance, high-reliability member such as an anisotropic conductive layer and a self-assembly anisotropic conductive paste (SAP).

The display pad area DPA may include a plurality of display pads DP. The display pads DP may be connected to a main processor through the circuit board 300. The display pads DP may be connected to the circuit board 300 to receive digital video data and to provide digital video data to the display driving unit 200.

Figure 7:
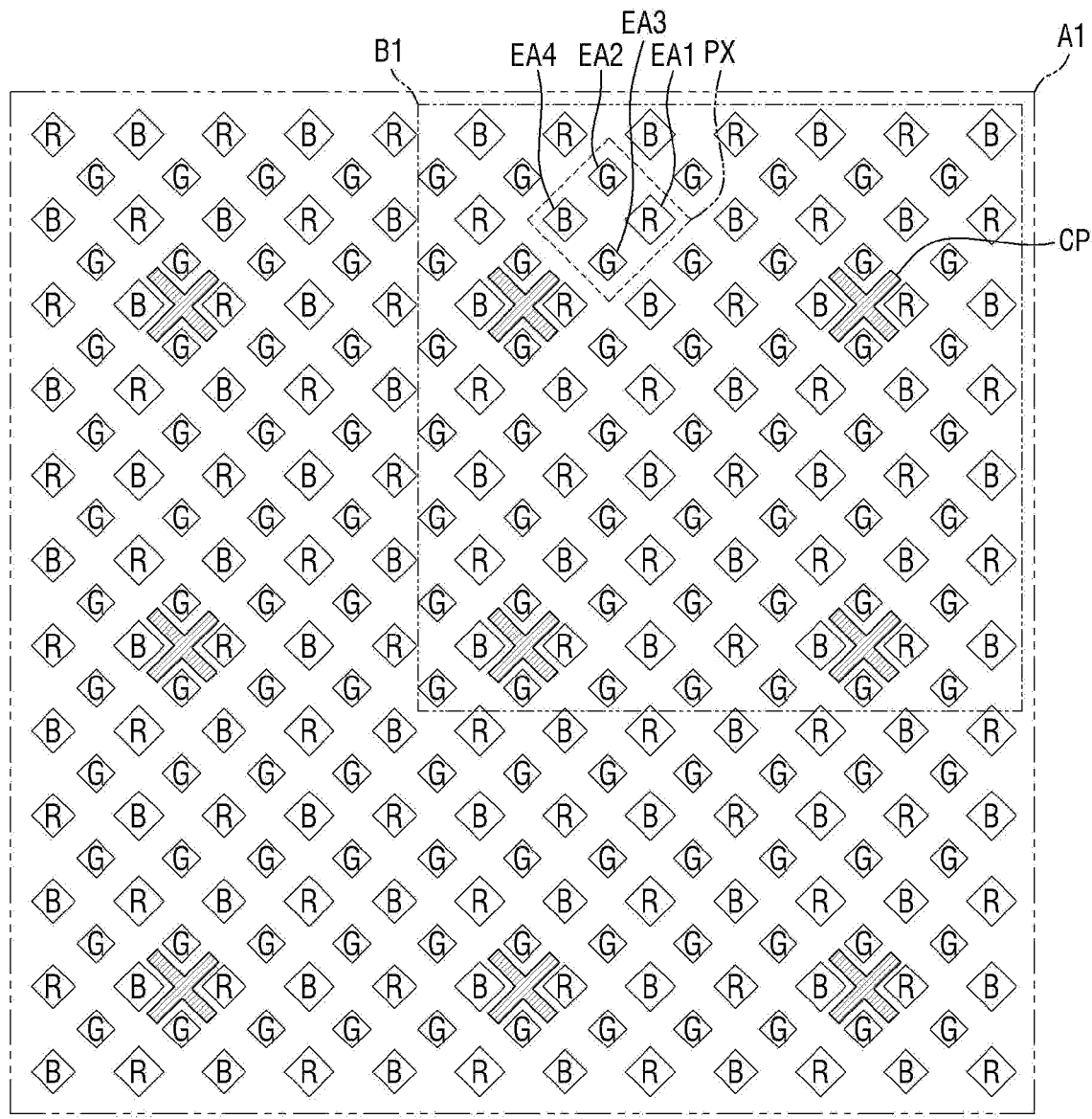
FIG. 7 is an enlarged plan view of an area A1 of FIG. 3.
Figure 8:
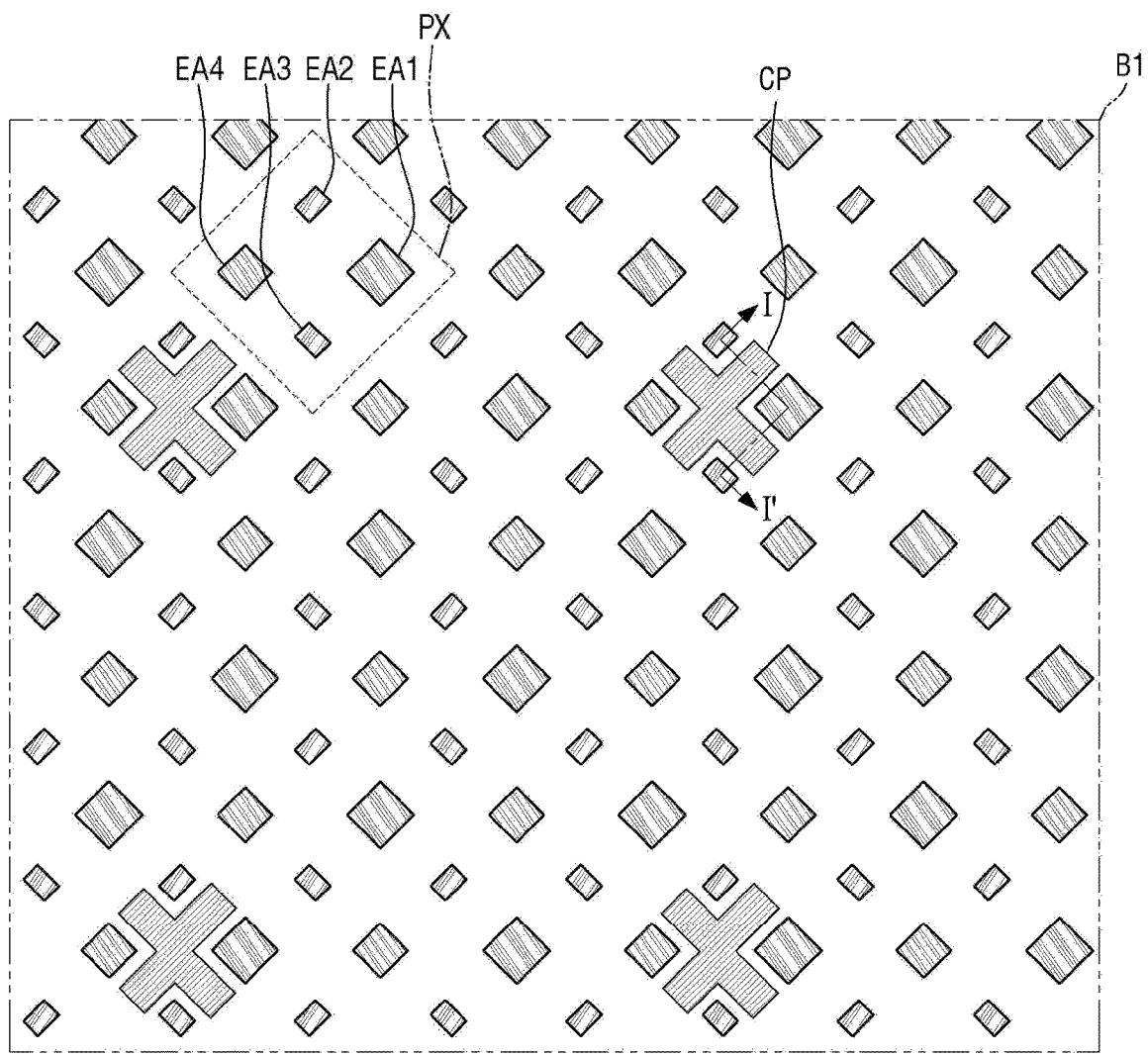
FIG. 8 is an enlarged plan view of an area B1 of FIG. 7.

FIG. 7 is an enlarged plan view of an area A1 of FIG. 3, and FIG. 8 is an enlarged plan view of an area B1 of FIG. 7.

Referring to FIGS. 7 and 8, each of the unit pixels PX may include first, second, third, and fourth subpixels SP1, SP2, SP3, and SP4, and the first, second, third, and fourth subpixels SP1, SP2, SP3, and SP4 may include first, second, third, and fourth emission areas EA1, EA2, EA3, and EA4, respectively. For example, the first emission area EA1 may emit first-color light or red light, the second and third emission areas EA2 and EA3 may emit second-color light or green light, and the fourth emission area EA4 may emit third-color light or blue light. The present invention is not limited thereto. For example, the third emission area EA3 may emit one of red light, and blue light or may emit white light. Each of the unit pixels PX may display white gradation via the first, second, third, and fourth emission areas EA1, EA2, EA3, and EA4. Gradations of white and various colors may be displayed by combinations of beams of light emitted from the first, second, third, and fourth emission areas EA1, EA2, EA3, and EA4. The present invention is not limited thereto. For example, each of a plurality of unit pixels PX may include first, second, and third subpixels SPX1, SPX2, and SPX3, and the first, second, and third subpixels SPX1, SPX2, and SPX3 may include first, second, and third emission areas EA1, EA2, and EA3, respectively. For example, the first emission area EA1 may emit first-color light or red light, the second emission area EA2 may emit second-color light or green light, and the third emission area EA3 may emit third-color light or blue light. Each of the pixels PX will hereinafter be described as including four emission areas, i.e., first, second, third, and fourth emission areas EA1, EA2, EA3, and EA4.

The light-emitting element layer EML may be provided in each of the first, second, third, and fourth emission areas EA1, EA2, EA3, and EA4 and may emit light. Position code patterns CP may be formed and disposed in the same layer as the anode electrodes of the light-emitting element layer EML, i.e., the pixel electrodes of the first, second, third, and fourth subpixels SP1, SP2, SP3, and SP4.

As illustrated in FIGS. 7 and 8, each of the position code patterns CP may be formed in a predetermined position code area in the form of a predetermined pattern. Each of the position code patterns CP may be formed between first, second, third, and fourth emission areas EA1, EA2, EA3, and EA4 corresponding to a predetermined position code area, in a predetermined planar pattern shape.

Each of the position code patterns CP may be formed at a region between a number of adjacent subpixels SP corresponding to a predetermined position code area, in the shape of a cross pattern. For example, each of the position code patterns CP may be formed between four adjacent subpixels SP, in the shape of a cross pattern. Each of the position code patterns CP may be formed in the area where the pixel-defining layer is to be formed, between the pixel electrodes of the first, second, third, and fourth subpixels SP1, SP2, SP3, and SP4, to be separate from the pixel electrodes of the first, second, third, and fourth subpixels SP1, SP2, SP3, and SP4.

The position code patterns CP may be formed between the subpixels SP in various other shapes, for example, in at least one polygonal shape from among a rectangular shape, a square shape, and a rhombus shape or a hybrid shape obtained by combining the at least one polygonal shape.

The position code patterns CP may be formed to have different sizes, different widths in at least one direction, different lengths in at least one direction, or different areas in at least one direction from one another.

Figure 9:
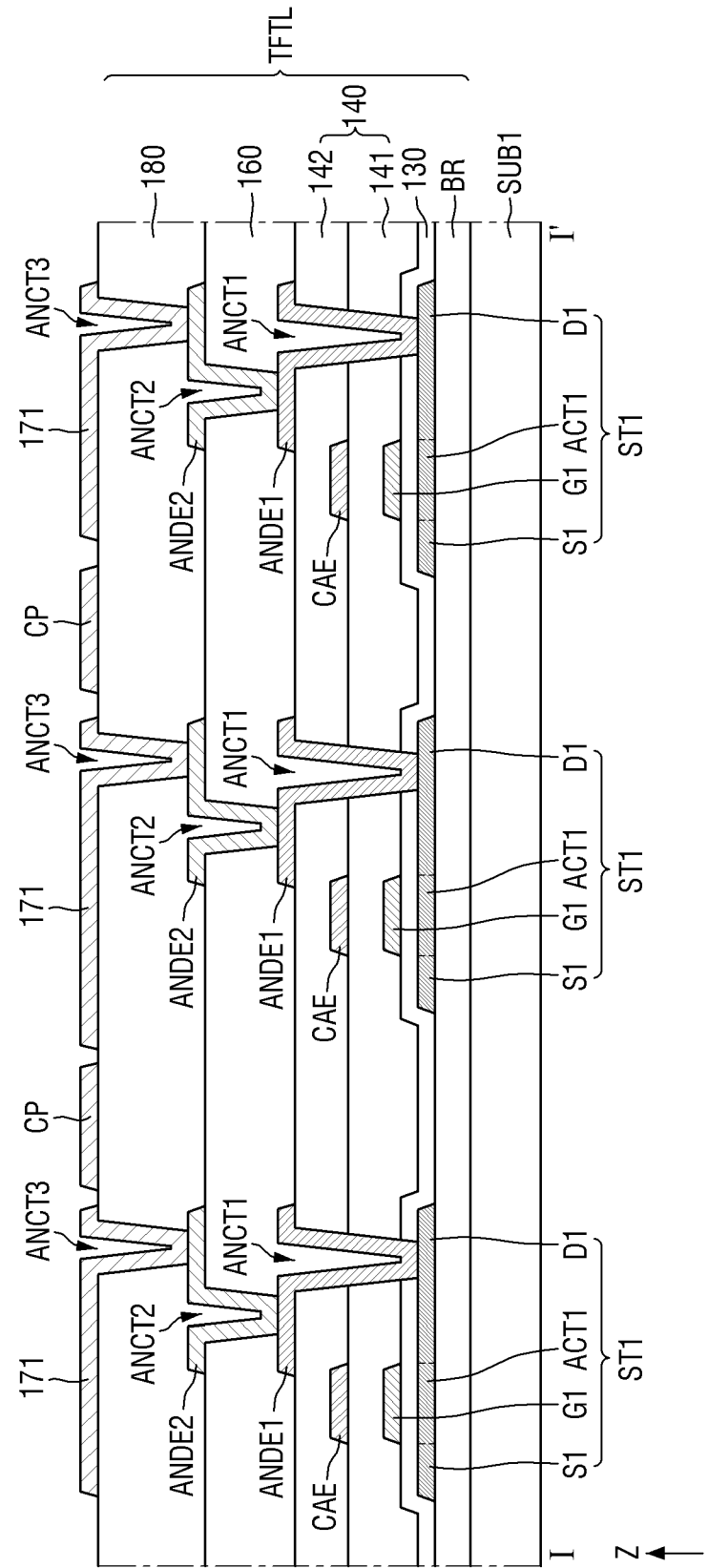
FIG. 9 is a cross-sectional view taken along line I-I' of FIG. 8 and illustrates pixel electrodes and position code patterns of a display panel.

FIG. 9 is a cross-sectional view taken along line I-I' of FIG. 8 and illustrates pixel electrodes and position code patterns of a display panel.

Referring to FIG. 9, a barrier layer BR may be disposed on the substrate SUB. The substrate SUB may include or may be formed of an insulating material such as a polymer resin. For example, the substrate SUB may include or may be formed of polyimide. The substrate SUB may be a flexible substrate that is bendable, foldable, or rollable.

The barrier layer BR is a film for protecting the transistors of the TFT layer TFTL and emission layers 172 of the light-emitting element layer EML from moisture that may infiltrate into the substrate SUB, which is susceptible to moisture. The barrier layer BR may include a plurality of inorganic layers that are alternately stacked. In one example, the barrier layer BR may be formed as a multilayer in which one or more inorganic layers such as a silicon nitride layer, a silicon oxynitride layer, a silicon oxide layer, a titanium oxide layer, and an aluminum oxide layer are alternately stacked on each other.

TFTs ST1 may be disposed on the barrier layer BR. The TFTs ST1 may include active layers ACT1, gate electrodes G1, source electrodes S1, and drain electrodes D1.

The active layers ACT1, the source electrodes S1, and the drain electrodes D1 of the TFTs ST1 are disposed on the barrier layer BR. The active layers ACT1 of the TFTs ST1 may include polycrystalline silicon, monocrystalline silicon, low-temperature polycrystalline silicon, amorphous silicon, or an oxide semiconductor. The active layers ACT1, which overlap the gate electrodes G1 in the thickness direction of the substrate SUB, i.e., in the third direction (or the Z-axis direction), may be defined as channel regions. The source electrodes S1 and the drain electrodes D1 may be regions that do not overlap the gate electrodes G1 in the third direction (or the Z-axis direction). The source electrodes S1 and the drain electrodes D1 may include a silicon or oxide semiconductor doped with ions or impurities and may thus have conductivity.

A gate insulating layer 130 may be disposed on the active layers ACT1, the source electrodes S1, and the drain electrodes D1 of the TFTs ST1. The gate insulating layer 130 may be formed as an inorganic layer such as, for example, a silicon nitride layer, a silicon oxynitride layer, a silicon oxide layer, a titanium oxide layer, and an aluminum oxide layer.

The gate electrodes G1 of the TFTs ST1 may be disposed on the gate insulating layer 130. The gate electrodes G1 may overlap the active layers ACT1 in the third direction (or the Z-axis direction). The gate electrodes G1 may be formed as single layers or multilayers including molybdenum (Mo), aluminum (Al), chromium (Cr), gold (Au), titanium (Ti), nickel (Ni), neodymium (Nd), copper (Cu), or an alloy thereof.

A first interlayer insulating layer 141 may be disposed on the gate electrodes G1 of the TFTs ST1. The first interlayer insulating layer 141 may be formed as an inorganic layer such as, for example, a silicon nitride layer, a silicon oxynitride layer, a silicon oxide layer, a titanium oxide layer, and an aluminum oxide layer. The first interlayer insulating layer 141 may be formed as a multilayer inorganic layer.

Capacitor electrodes CAE may be disposed on the first interlayer insulating layer 141. The capacitor electrodes CAE may overlap the gate electrodes G1 of the TFTs ST1 in the third direction (or the Z-axis direction). As the first interlayer insulating layer 141 has a predetermined dielectric constant, capacitors may include or may be formed of the capacitor electrodes CAE, the gate electrodes G1, and the first interlayer insulating layer 141. The capacitor electrodes CAE may be formed as single layers or multilayers including Mo, Al, Cr, Au, Ti, Ni, Nd, Cu, or an alloy thereof.

A second interlayer insulating layer 142 may be disposed on the capacitor electrodes CAE. The second interlayer insulating layer 142 may be formed as an inorganic layer such as, for example, a silicon nitride layer, a silicon oxynitride layer, a silicon oxide layer, a titanium oxide layer, and an aluminum oxide layer. The second interlayer insulating layer 142 may be formed as a multilayer inorganic layer.

First anode connecting electrodes ANDE1 may be disposed on the second interlayer insulating layer 142. The first anode connecting electrodes ANDE1 may be connected to the drain electrodes D1 of the TFTs ST1 through first connecting contact holes ANCT1, which penetrate the gate insulating layer 130, the first interlayer insulating layer 141, and the second interlayer insulating layer 142. The first anode connecting electrodes ANDE1 may be formed as single layers or multilayers including Mo, Al, Cr, Au, Ti, Ni, Nd, Cu, or an alloy thereof.

A first planarization layer 160 for planarizing or reducing any height differences formed by the TFTs ST1 may be disposed on the first anode connecting electrodes ANDE1. The first planarization layer 160 may be formed as an organic layer including an acrylic resin, an epoxy resin, a phenolic resin, a polyamide resin, or a polyimide resin.

Second anode connecting electrodes ANDE2 may be disposed on the first planarization layer 160. The second anode connecting electrodes ANDE2 may be connected to the first anode connecting electrodes ANDE1 through second connecting contact holes ANCT2, which penetrate the first planarization layer 160. The second anode connecting electrodes ANDE2 may be formed as single layers or multilayers including Mo, Al, Cr, Au, Ti, Ni, Nd, Cu, or an alloy thereof.

A second planarization layer 180 may be disposed on the second anode connecting electrodes ANDE2. The second planarization layer 180 may be formed as an organic layer including an acrylic resin, an epoxy resin, a phenolic resin, a polyamide resin, or a polyimide resin.

Light-emitting elements LEL, pixel electrodes 171, and position code patterns CP may be disposed on the second planarization layer 180. The light-emitting elements LEL include a pixel electrodes 171, emission layers 172, and a common electrode 173.

The pixel electrodes 171 and the position code patterns CP may each be formed into a predetermined planar shape through the same patterning, on the second planarization layer 180. The pixel electrodes 171 may be connected to the second anode connecting electrodes ANDE2 through third connecting contact holes ANCT3, which penetrate the second planarization layer 180. The position code patterns CP may be formed between the pixel electrodes 171 to be separate from the pixel electrodes 171.

In a top emission structure that emits light in a direction from the emission layers 172 to the common electrode 173, the pixel electrodes 171 and the position code patterns CP may include or may be formed of a metallic material with high reflectance such as a stack of Al and Ti (e.g., Ti/Al/Ti), a stack of Al and indium tin oxide (ITO) (e.g., ITO/Al/ITO), a silver-palladium-copper (APC) alloy, and a stack of an APC alloy and ITO (e.g., TO/APC/ITO).

Figure 10:
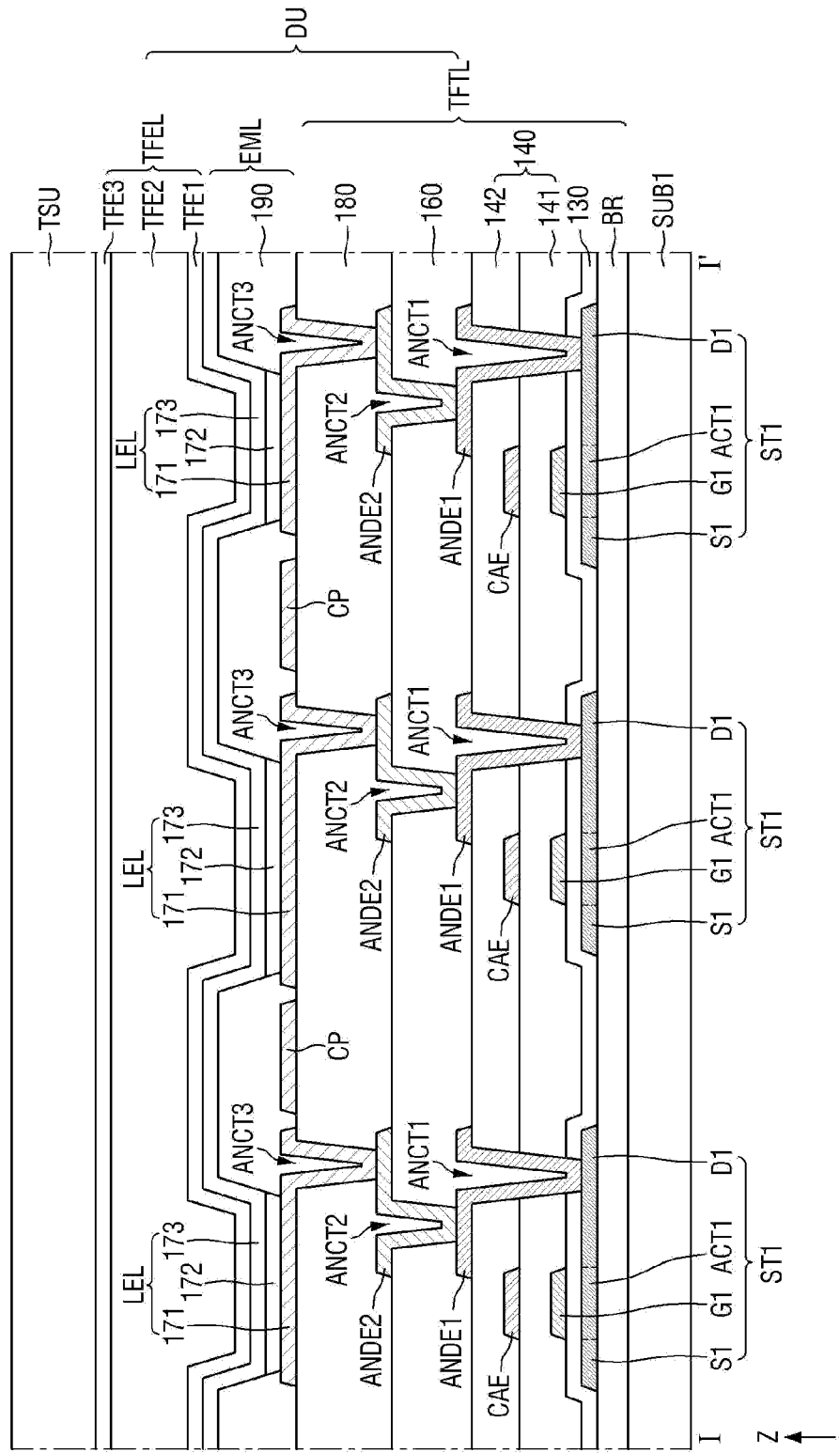
FIG. 10 is a cross-sectional view taken along line I-I' of FIG. 8 and illustrates how to fabricate a display panel.

FIG. 10 is a cross-sectional view taken along line I-I' of FIG. 8 and illustrates how to fabricate a display panel.

Referring to FIG. 10, as each of the position code patterns CP is formed between the pixel electrodes 171, i.e., in an area where a pixel-defining layer 190 is to be formed, the pixel-defining layer 190 may be formed on the second planarization layer 180 to entirely cover the position code patterns CP.

The pixel-defining layer 190 may be formed on the second planarization layer 180 to cover the position code patterns CP and separate the pixel electrodes 171 and may thus define the first, second, third, and fourth emission areas EA1, EA2, EA3, and EA4. The pixel-defining layer 190 may be disposed to cover the edges of each of the pixel electrodes 171. The pixel-defining layer 190 may be formed as a transparent organic layer to minimize its influence on the infrared (IR) reflectivity of the position code patterns CP. The pixel-defining layer 190 may be formed as an organic layer such as a photosensitive polyimide resin layer, a polyamide resin layer, a black pixel-defining layer (PDL), and a polyimide resin layer.

First, second, third, and fourth emission areas EA1, EA2, EA3, and EA4 refer to regions where the pixel electrodes 171, the emission layers 172, and the common electrode 173 are sequentially stacked on each other, and holes from the pixel electrodes 171 and electrons from the common electrode 173 may combine together to emit light.

The emission layers 172 may be disposed on the pixel electrodes 171. The emission layers 172 may include an organic material and may emit light of a predetermined color. In one example, the emission layers 172 may include hole transport layers, organic material layers, and electron transport layers.

The common electrode 173 may be disposed on the emission layers 172. The common electrode 173 may be disposed to cover the emission layers 172. The common electrode 173 may be a layer formed in common in all the first, second, third, and fourth emission areas EA1, EA2, EA3, and EA4. For example, the common electrode 173 may be continuously formed in the first, second, third, and fourth emission areas EA1, EA2, EA3, and EA4. A capping layer may be formed on the common electrode 173.

In the top emission structure, the common electrode 173 may include or may be formed of a transparent conductive oxide (TCO), capable of transmitting light therethrough, such as ITO and indium zinc oxide (IZO), or a semitransparent conductive material such as magnesium (Mg), silver (Ag), or an alloy thereof. In a case where the common electrode 173 is formed of a semitransparent metallic material, the emission efficiency of the light-emitting elements LEL may be improved due to microcavities.

The encapsulation layer TFEL may be disposed on the common electrode 173. The encapsulation layer TFEL may include at least one inorganic layer to prevent the infiltration of oxygen or moisture into the light-emitting element layer EML. The encapsulation layer TFEL may include at least one organic layer to protect the light-emitting element layer EML from a foreign material such as dust. In one example, the encapsulation layer TFEL may include a first encapsulation inorganic layer TFE1, an encapsulation organic layer TFE2, and a second encapsulation inorganic layer TFE3.

The first encapsulation inorganic layer TFE1 may be disposed on the common electrode 173, the encapsulation organic layer TFE2 may be disposed on the first encapsulation inorganic layer TFE1, and the second encapsulation inorganic layer TFE3 may be disposed on the encapsulation organic layer TFE2. The first and second encapsulation inorganic layers TFE1 and TFE3 may be formed as multilayers in which one or more inorganic layers such as a silicon nitride layer, a silicon oxynitride layer, a silicon oxide layer, a titanium oxide layer, and an aluminum oxide layer are alternately stacked on each other. The encapsulation organic layer TFE2 may be formed as an organic layer including an acrylic resin, an epoxy resin, a phenolic resin, a polyamide resin, or a polyimide resin.

The touch sensing unit TSU may be mounted and disposed on the encapsulation layer TFEL.

Figure 11:
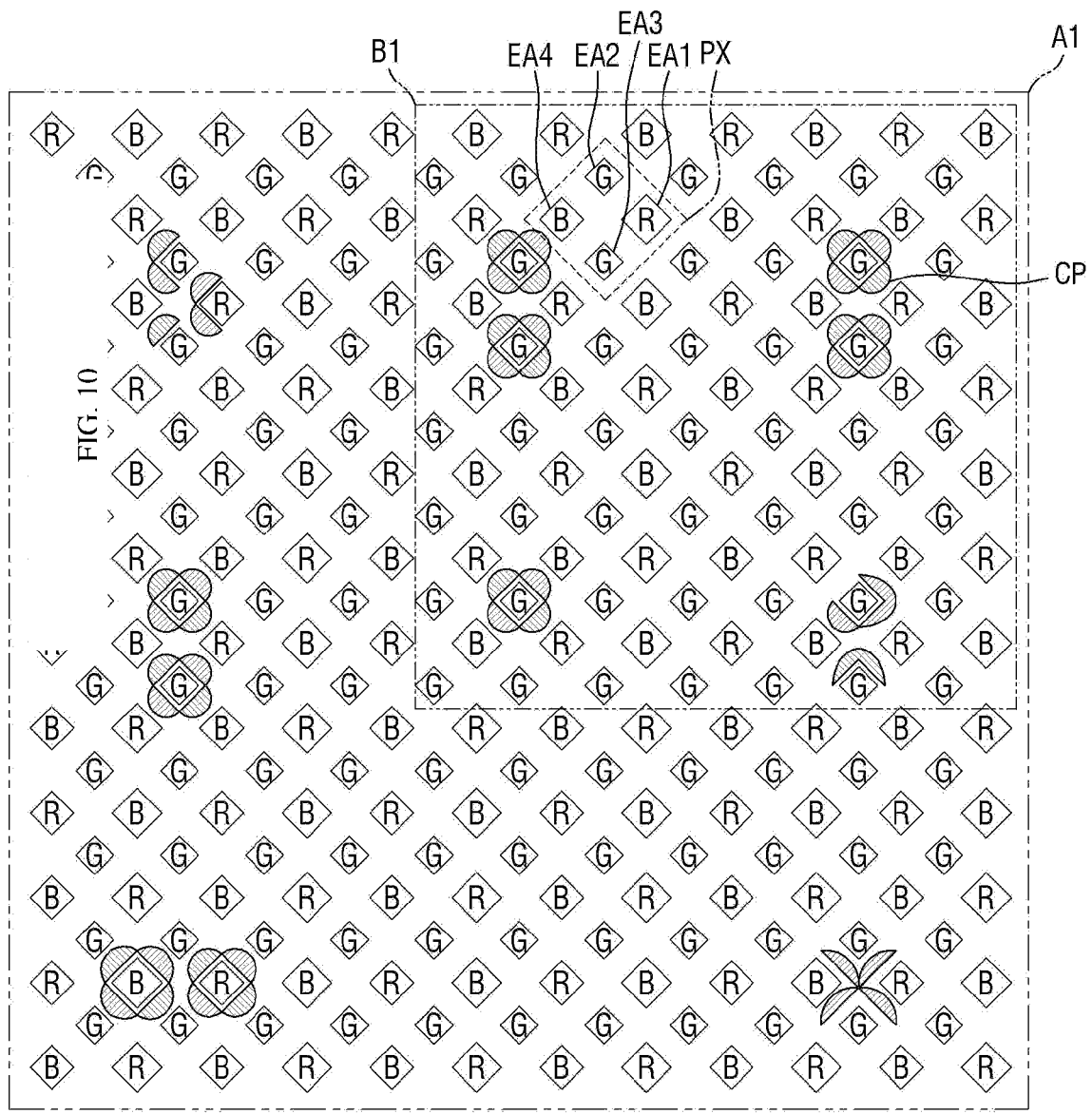
FIG. 11 is an enlarged plan view of the area A1 of FIG. 3.
Figure 12:
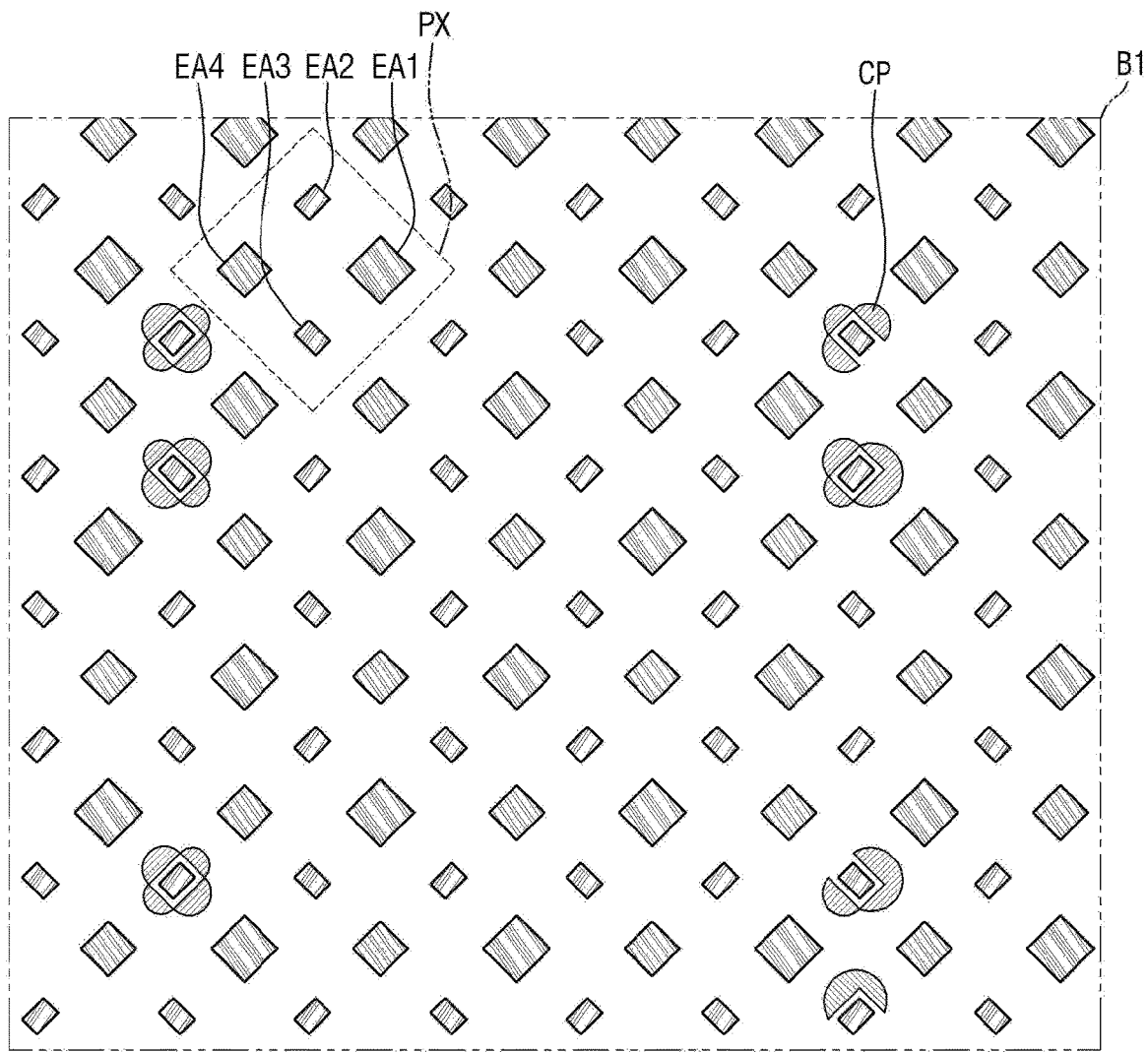
FIG. 12 is an enlarged plan view of an area B1 of FIG. 11.

FIG. 11 is an enlarged plan view of the area A1 of FIG. 3. FIG. 12 is an enlarged plan view of an area B1 of FIG. 11.

Referring to FIGS. 11 and 12, position code patterns CP are formed and disposed on the light-emitting element layer EML of each of a plurality of emission areas (EA1, EA2, EA3, and EA4), particularly, on the second planarization layer 180 where pixel electrodes 171 are disposed.

Each of the position code patterns CP may be formed in a predetermined position code area in the form of a predetermined pattern. Specifically, each of the position code patterns CP may be formed in an area between the emission areas (EA1, EA2, EA3, and EA4) that corresponds to a predetermined position code area, in a predetermined planar code shape. Each of the position code patterns CP may be formed in the area in which the pixel-defining layer 190 is to be formed, between the pixel electrodes 171, to be separate from the pixel electrodes 171 of the emission areas (EA1, EA2, EA3, and EA4).

Each of the position code patterns CP may be formed in a fan shape, a semicircular shape, a circular shape, or a combination thereof, between four adjacent subpixels SP. The position code patterns CP may be formed to have different sizes, different widths in at least one direction, different lengths in at least one direction, or different areas in at least one direction from one another.

Accordingly, the position input device 20 may emit IR light to the display unit DU and may continuously or periodically generate shape data of the position code patterns CP based on the amount and the pattern of IR light reflected from the display unit DU. Then, the position input device 20 may identify the structure and the shape of the position code patterns CP and may extract data codes corresponding to the result of the identification. In this manner, the position input device 20 may combine the extracted data codes and may generate and transmit position coordinate data corresponding to the result of the combination.

Figure 13:
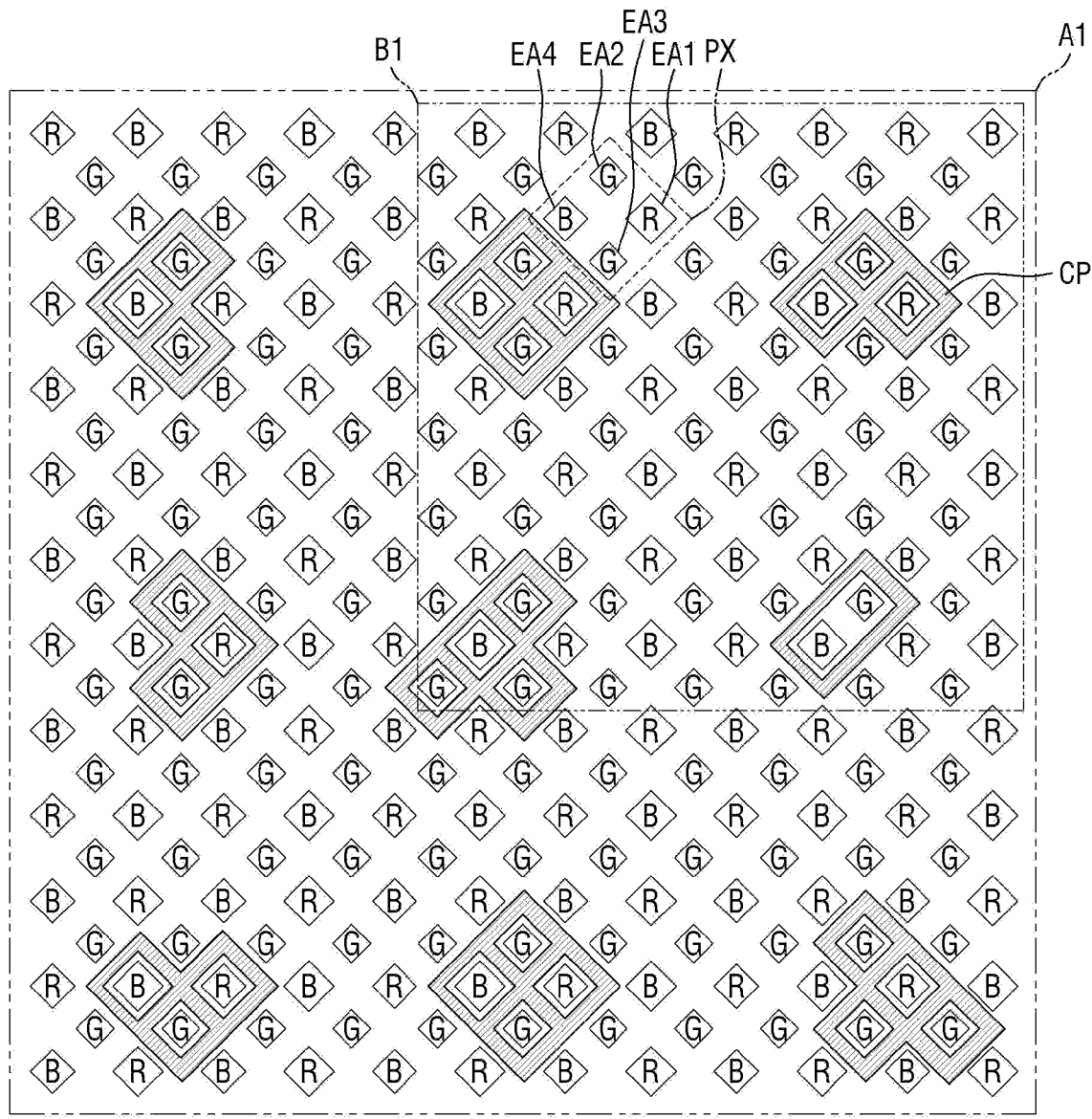
FIG. 13 is an enlarged plan view of the area A1 of FIG. 3.
Figure 13:
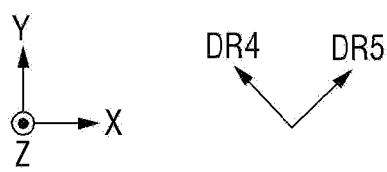
Figure 14:
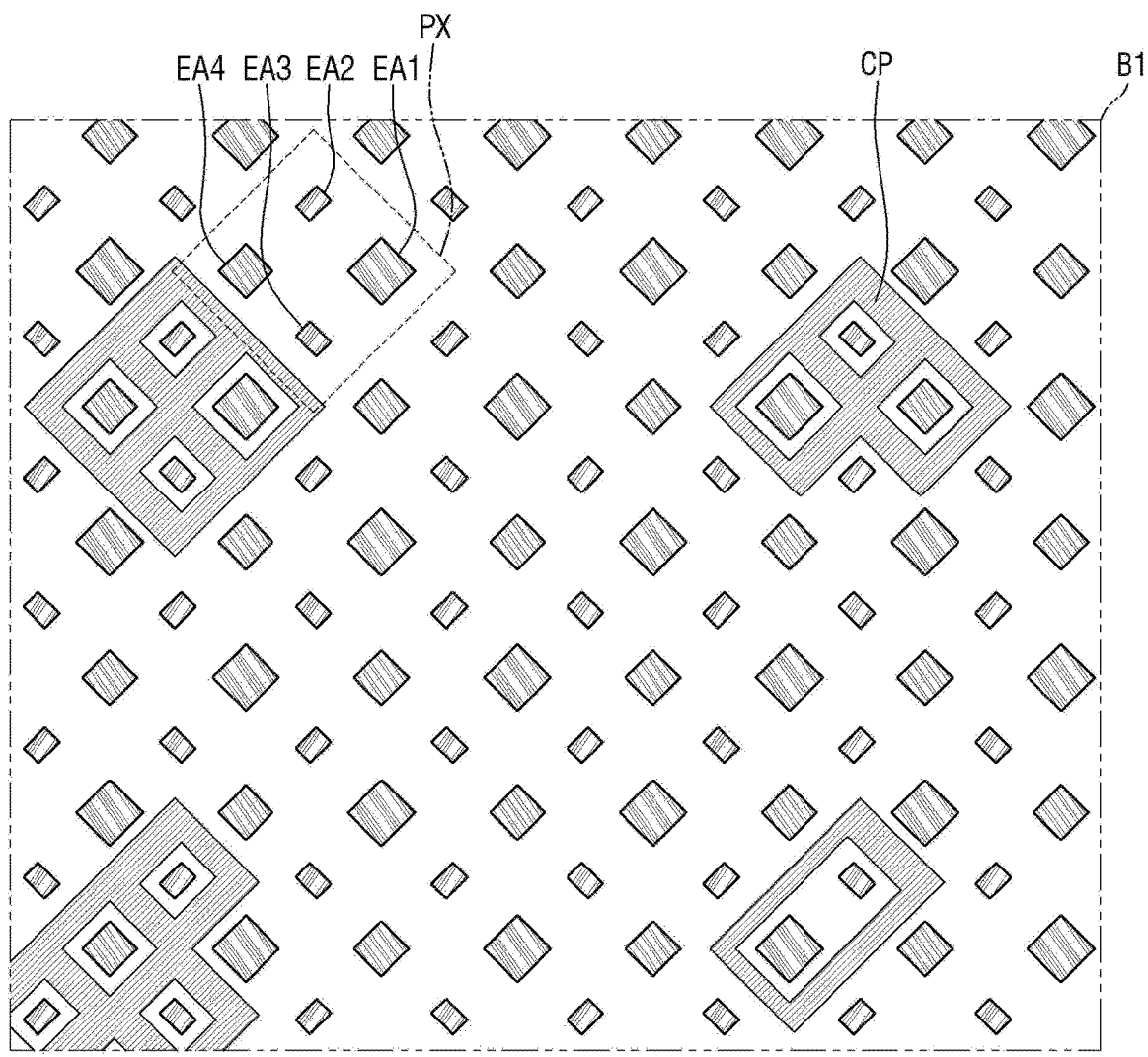
FIG. 14 is an enlarged plan view of an area B1 of FIG. 13.
Figure 14:
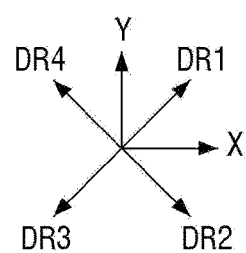

FIG. 13 is an enlarged plan view of the area A1 of FIG. 3. FIG. 14 is an enlarged plan view of an area B1 of FIG. 13.

Referring to FIGS. 13 and 14, each of position code patterns CP may be formed in a predetermined position code area in the form of a predetermined pattern. Specifically, each of the position code patterns CP may be formed in a predetermined planar code shape to surround at least one emission area formed in a predetermined position code area. In other words, each of the position code patterns CP may be formed to surround at least one pixel electrode 171 of at least one emission area to be separate from the at least one pixel electrode 171.

Each of the position code patterns CP may be formed in the shape of at least one polygonal closed loop such as a rectangular shape, a square shape, a rhombus shape, a pentagonal shape, and a hexagonal shape to surround at least one emission area. The position code patterns CP may be formed to have different sizes, different widths in at least one direction, different lengths in at least one direction, or different areas in at least one direction from one another.

Each of the position code patterns CP may be formed in the position code area as a mesh pattern surrounding each of a plurality of emission areas formed in a predetermined position code area.

Figure 15:
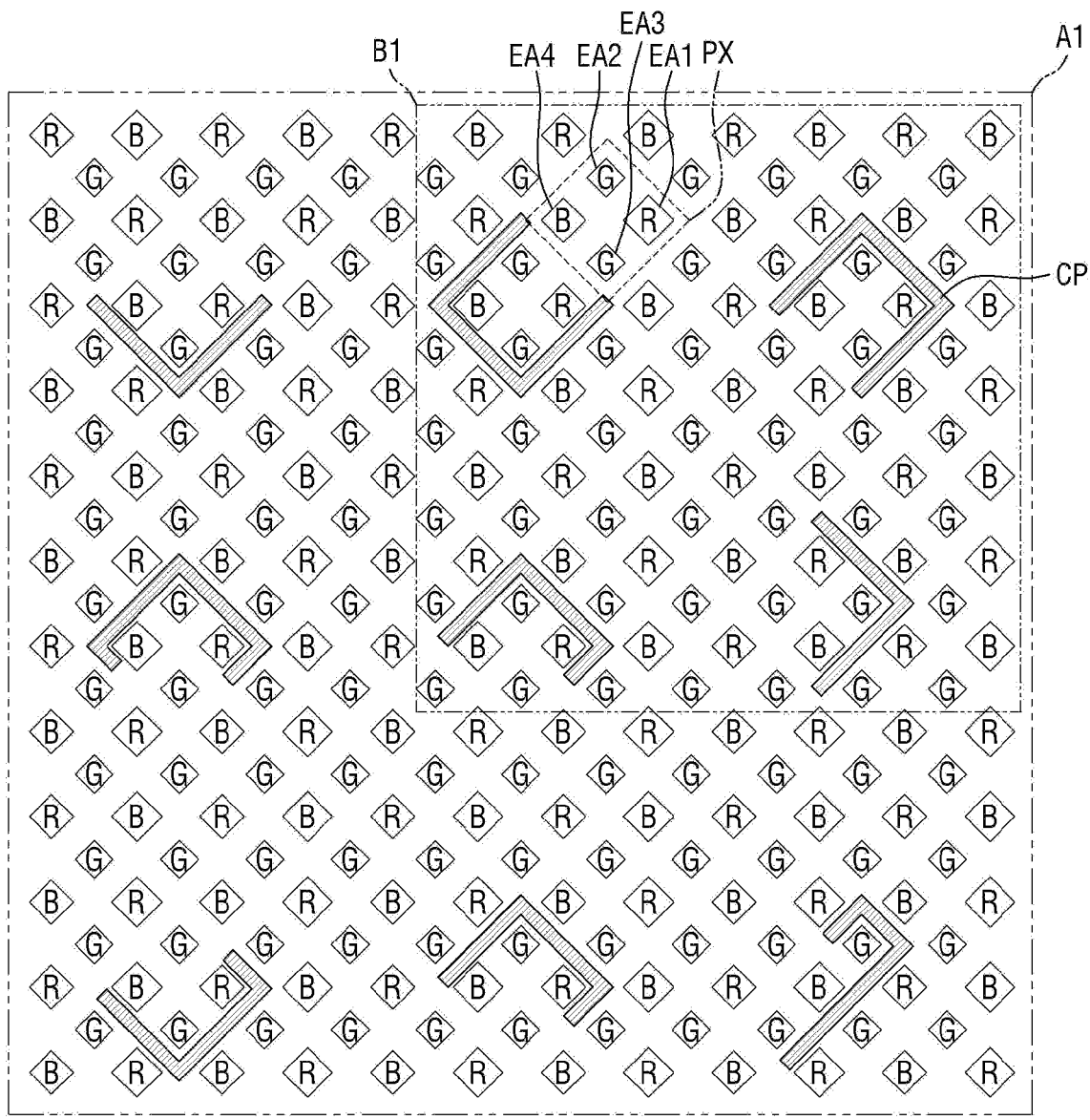
FIG. 15 is an enlarged plan view of the area A1 of FIG. 3.
Figure 16:
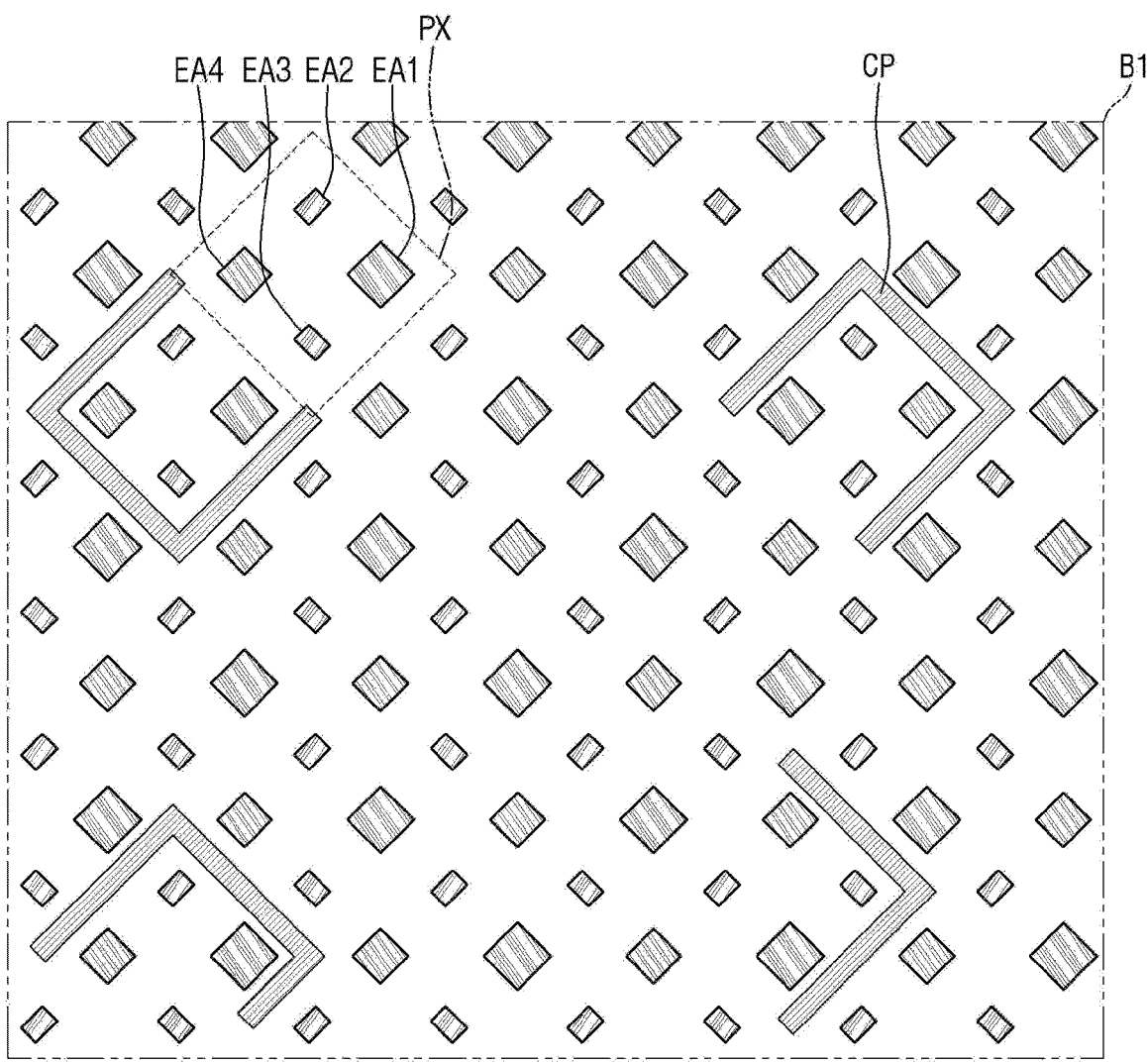
FIG. 16 is an enlarged plan view of an area B1 of FIG. 15.
Figure 16:
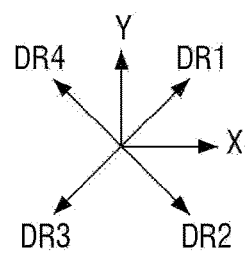

FIG. 15 is an enlarged plan view of the area A1 of FIG. 3. FIG. 16 is an enlarged plan view of an area B1 of FIG. 15.

Referring to FIGS. 15 and 16, each of position code patterns CP may be formed in a predetermined planar code shape to surround part of at least one emission area formed in a predetermined position code area. In other words, each of the position code patterns CP may be formed to surround part of at least one pixel electrode 171 of at least one emission area to be separate from the at least one pixel electrode 171.

Specifically, each of the position code patterns CP may be formed in an open loop shape surrounding part of at least one emission area. The position code patterns CP may be formed in the shape of a straight line or a curved line with a predetermined length or an irregular polygon with a predetermined curvature.

Accordingly, the position input device 20 may emit IR light to the display unit DU and may continuously or periodically generate shape data of the position code patterns CP based on the amount and the pattern of IR light reflected from the display unit DU. Then, the position input device 20 may identify the structure and the shape of the position code patterns CP and may extract data codes corresponding to the result of the identification. In this manner, the position input device 20 may combine the extracted data codes and may generate and transmit position coordinate data corresponding to the result of the combination.

Figure 17:
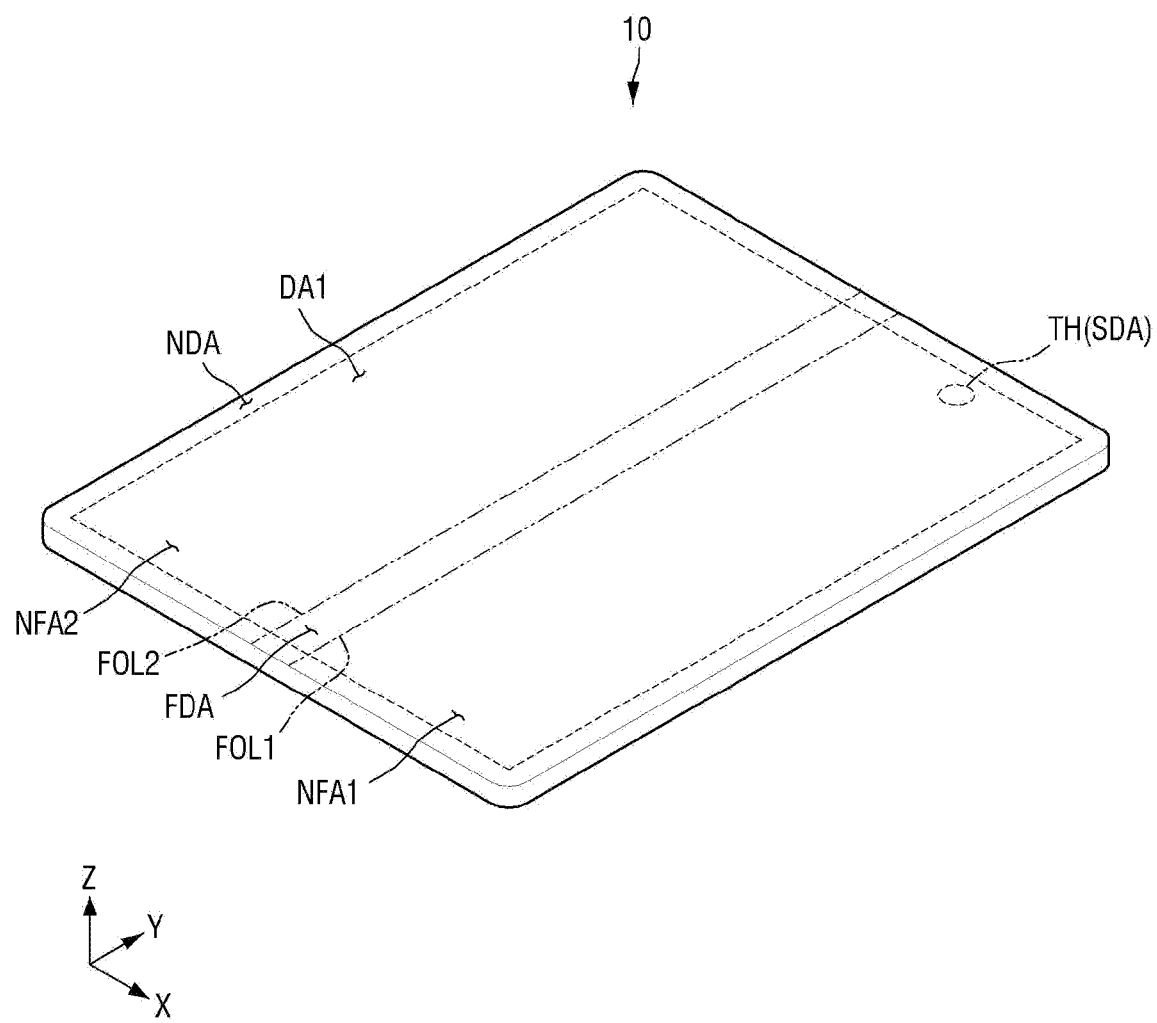
FIGS. 17 and 18 are perspective views of a display device according to an embodiment of the present disclosure.
Figure 18:
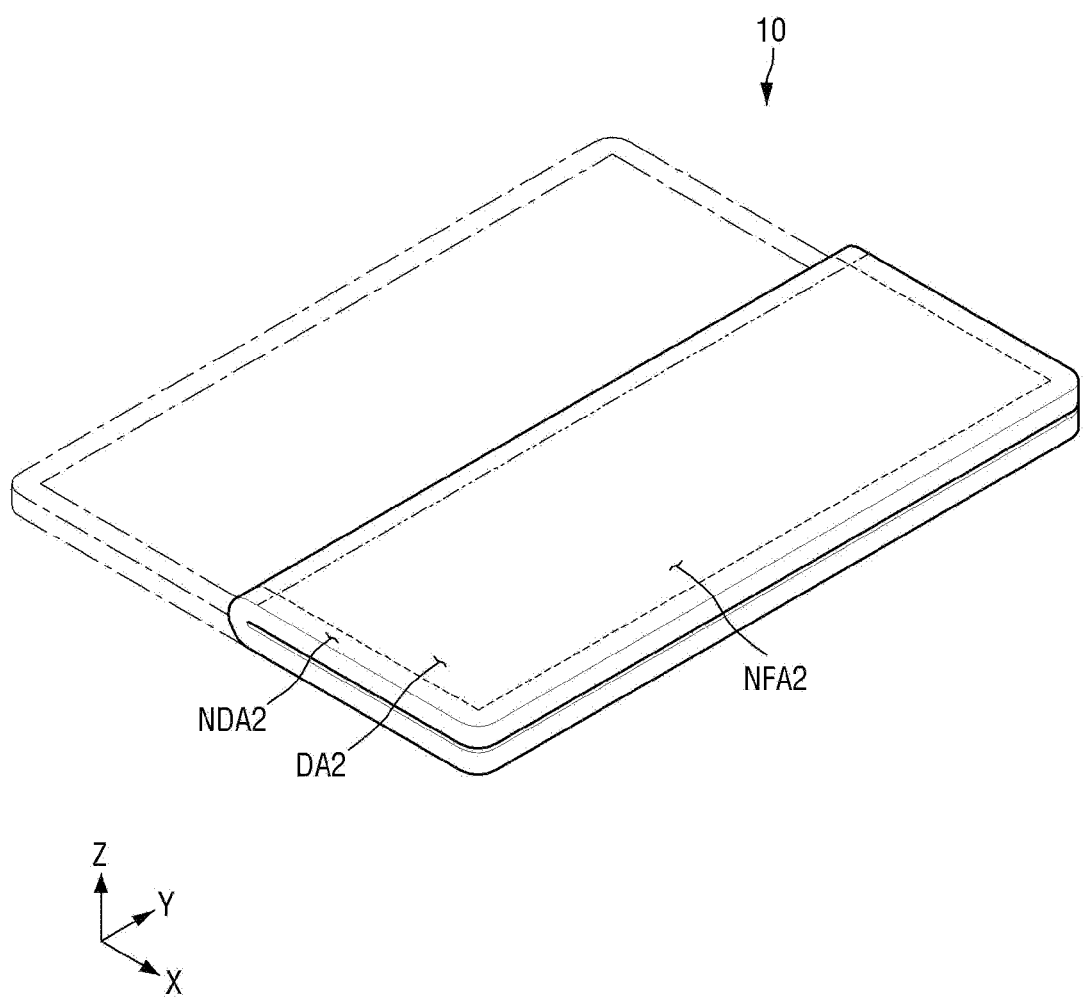

FIGS. 17 and 18 are perspective views of a display device according to an embodiment of the present disclosure.

FIGS. 17 and 18 illustrate a foldable display device 10 that may be folded in a first direction (or an X-axis direction). Referring to FIGS. 17 and 18, the display device 10 may be able to maintain a folded state and an unfolded state. The display device 10 may be folded in so that the front surface of the display device 10 may be disposed on the inside of the display device 10. In this case, parts of the front surface of the display device 10 may be disposed to face each other. In an embodiment, the display device 10 may be folded out so that the front surface of the display device 10 may be disposed on the outside of the display device 10. In this case, parts of the rear surface of the display device 10 may be disposed to face each other.

A first non-folding area NFA1 may be disposed on one side, for example, the right side, of a folding area FDA. A second non-folding area NFA2 may be disposed on the other side, for example, the left side, of the folding area FDA. A touch sensing unit TSU may be formed and disposed in each of the first and second non-folding areas NFA1 and NFA2.

First and second folding lines FOL1 and FOL2 may extend in the second direction (or the Y-axis direction), and the display device 10 may be folded in the first direction (or the X-axis direction). As a result, since the length, in the first direction (or the X-axis direction), of the display device 10 may be reduced to about a half, a user can easily carry the display device 10 around.

The direction in which the first and second folding lines FOL1 and FOL2 extend is not particularly limited to the second direction (or the Y-axis direction). In an embodiment, the first and second folding lines FOL1 and FOL2 may extend in the first direction (or the X-axis direction), and the display device 10 may be folded in the second direction (or the Y-axis direction). In this case, the length, in the second direction (or the Y-axis direction), of the display device 10 may be reduced by about a half. In an embodiment, the first and second folding lines FOL1 and FOL2 may extend in a diagonal direction of the display device 10 between the first direction (or the X-axis direction) and the second direction (or the Y-axis direction). In this case, the display device 10 may be folded into a triangular shape.

In a case where the first and second folding lines FOL1 and FOL2 extend in the second direction (or the Y-axis direction), the length, in the first direction (or the X-axis direction), of the folding area FDA may be less than the length, in the second direction (or the Y-axis direction), of the folding area FDA. The length, in the first direction (or the X-axis direction), of the first non-folding area NFA1 may be greater than the length, in the first direction (or the X-axis direction), of the folding area FDA. The length, in the first direction (or the X-axis direction), of the second non-folding area NFA2 may be greater than the length, in the first direction (or the X-axis direction), of the folding area FDA.

A first display area DA1 may be disposed on the front surface of the display device 10. The first display area DA1 may overlap the folding area FDA, the first non-folding area NFA1, and the second non-folding area NFA2. Thus, when the display device 10 is unfolded, an image may be displayed in the folding area FDA, the first non-folding area NFA1, and the second non-folding area NFA2 of the display device 10 in a forward direction.

A second display area DA2 may be disposed on the rear surface of the display device 10. The second display area DA2 may overlap the second non-folding area NFA2. Thus, when the display device 10 is folded up, an image may be displayed in the second non-folding area NFA2 of the display device 10 in the forward direction.

FIGS. 17 and 18 illustrate a through hole TH where, for example, a camera SDA, is disposed is formed in the first non-folding area NFA1, but the present disclosure is not limited thereto. In an embodiment, the through hole TH and the camera SDA may be disposed in the second non-folding area NFA2 or the folding area FDA.

Figure 19:
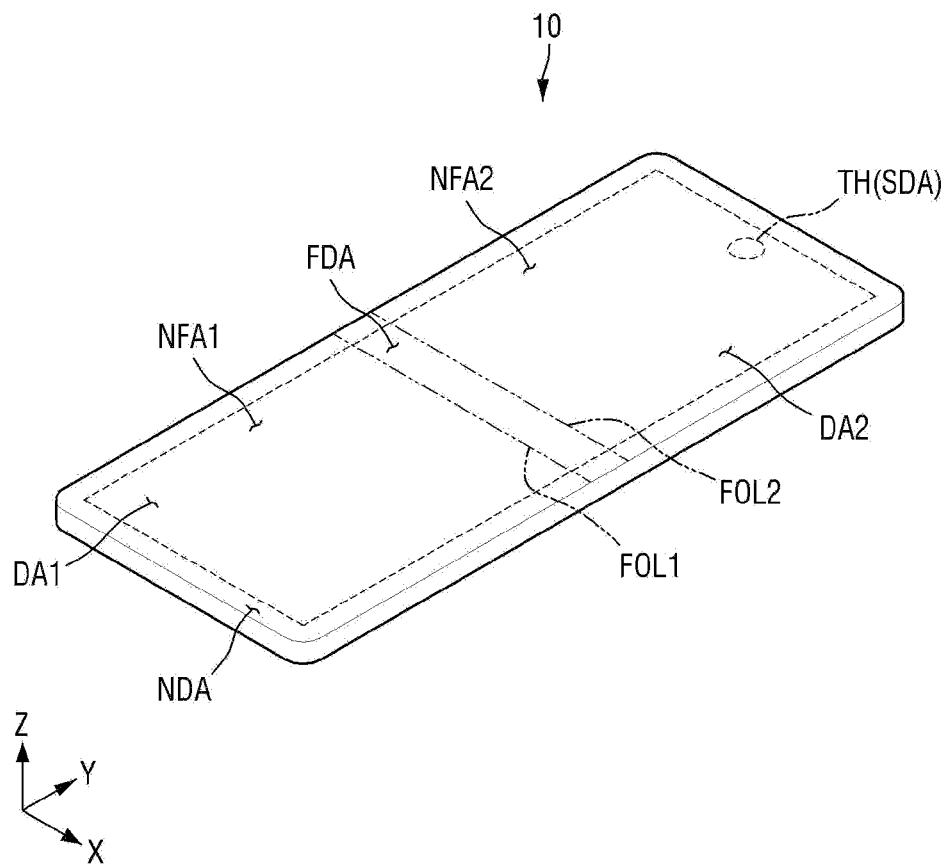
FIGS. 19 and 20 are perspective views of a display device according to an embodiment of the present disclosure.
Figure 20:
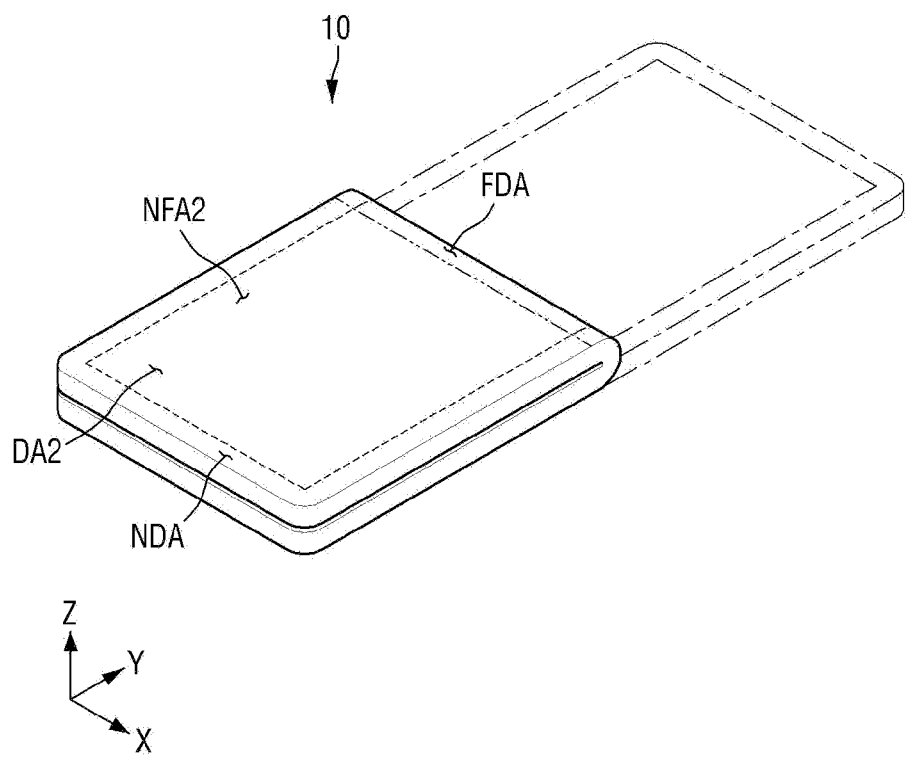

FIGS. 19 and 20 are perspective views of a display device according to an embodiment of the present disclosure.

FIGS. 19 and 20 illustrate a foldable display device 10 that can be folded in a second direction (or a Y-axis direction). Referring to FIGS. 19 and 20, the display device 10 may maintain a folded state and an unfolded state. The display device 10 may be folded in so that the front surface of the display device 10 may be disposed on the inside of the display device 10. In this case, parts of the front surface of the display device 10 may be disposed to face each other. In an embodiment, the display device 10 may be folded out so that the front surface of the display device 10 may be disposed on the outside of the display device 10. In this case, parts of the rear surface of the display device 10 may be disposed to face each other.

The display device 10 may include a folding area FDA, a first non-folding area NFA1, and a second non-folding area NFA2. The folding area FDA may be an area where the display device 10 is folded, and the first and second non-folding areas NFA1 and NFA2 may be areas where the display device 10 is not folded. The first non-folding area NFA1 may be disposed on one side of the folding area FDA, for example, on the lower side of the folding area FDA, and the second non-folding area NFA2 may be disposed on the other side of the folding area FDA, for example, on the upper side of the folding area FDA.

A touch sensing unit TSU may be formed and disposed in each of the first and second non-folding areas NFA1 and NFA2.

The folding area FDA may be an area that is curved or bent with a predetermined curvature along first and second folding lines FOL1 and FOL2. Thus, the first folding line FOL1 may be the boundary between the folding area FDA and the first non-folding area NFA1, and the second folding line FOL2 may be the boundary between the folding area FDA and the second non-folding area NFA2.

The first and second folding lines FOL1 and FOL2 may extend in a first direction (or an X-axis direction), and the display device 10 may be folded in the second direction (or the Y-axis direction). As a result, since the length, in the second direction (or the Y-axis direction), of the display device 10 may be reduced by about a half, a user can easily carry the display device 10 around.

The direction in which the first and second folding lines FOL1 and FOL2 extend is not particularly limited to the first direction (or the X-axis direction). In an embodiment, the first and second folding lines FOL1 and FOL2 may extend in the second direction (or the Y-axis direction), and the display device 10 may be folded in the first direction (or the X-axis direction). In this case, the length, in the first direction (or the X-axis direction), of the display device 10 may be reduced by about a half. In an embodiment, the first and second folding lines FOL1 and FOL2 may extend in a diagonal direction of the display device 10 between the first direction (or the X-axis direction) and the second direction (or the Y-axis direction). In this case, the display device 10 may be folded into a triangular shape.

In a case where the first and second folding lines FOL1 and FOL2 extend in the first direction (or the X-axis direction), as illustrated in FIGS. 19 and 20, the length, in the second direction (or the Y-axis direction), of the folding area FDA may be less than the length, in the first direction (or the X-axis direction), of the folding area FDA. The length, in the second direction (or the Y-axis direction), of the first non-folding area NFA1 may be greater than the length, in the second direction (or the Y-axis direction), of the folding area FDA. The length, in the second direction (or the Y-axis direction), of the second non-folding area NFA2 may be greater than the length, in the second direction (or the Y-axis direction), of the folding area FDA.

A first display area DA1 may be disposed on the front surface of the display device 10. The first display area DA1 may overlap the folding area FDA, the first non-folding area NFA1, and the second non-folding area NFA2. Thus, when the display device 10 is unfolded, an image may be displayed in the folding area FDA, the first non-folding area NFA1, and the second non-folding area NFA2 of the display device 10 in a forward direction.

A second display area DA2 may be disposed on the rear surface of the display device 10. The second display area DA2 may overlap the second non-folding area NFA2. Thus, when the display device 10 is folded up, an image may be displayed in the second non-folding area NFA2 of the display device 10 in the forward direction.

FIGS. 19 and 20 illustrate a through hole TH where, for example, a camera SDA, is disposed is formed in the first non-folding area NFA1, but the present disclosure is not limited thereto. In an embodiment, the through hole TH and the camera SDA may be disposed in the second non-folding area NFA2 or the folding area FDA.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising:
   a plurality of unit pixels on a substrate, wherein each unit pixel of the plurality of unit pixels includes a plurality of subpixels;
   a plurality of position code patterns having a predetermined position code shape, wherein, when viewed in a plan view, each position code pattern of the plurality of position code patterns is disposed at a region between at least two adjacent subpixels among the plurality of subpixels; and
   a pixel-defining layer covering the plurality of position code patterns and defining a region where each subpixel of the plurality of subpixels is disposed,
   wherein the plurality of position code patterns are formed in a planar code shape and are configured to reflect light incident through the pixel-defining layer,
   wherein each subpixel of the plurality of subpixels includes a light-emitting element, which includes a pixel electrode, an emission layer, and a common electrode,
   wherein, when viewed in a plan view, each position code pattern of the plurality of position code patterns is disposed at a corresponding unit pixel of the plurality of unit pixels and is disposed between at least two adjacent pixel electrodes of a plurality of pixel electrodes in the corresponding unit pixel,
   wherein, when viewed in the plan view, each position code pattern is spaced apart from the at least two adjacent pixel electrodes in the corresponding unit pixel, and
   wherein the plurality of position code patterns are formed and disposed on the same layer as the plurality of pixel electrodes using the same metal material as the plurality of pixel electrodes.

2. The display device of claim 1,
   wherein the plurality of subpixels include a plurality of red subpixels, a plurality of green subpixels, and a plurality of blue subpixels or include a plurality of red subpixels, a plurality of green subpixels, a plurality of blue subpixels, and a plurality of white subpixels, and
   wherein the plurality of subpixels are arranged in a vertical stripe configuration, a horizontal stripe configuration, or a Pentile™ matrix configuration.

3. The display device of claim 1,
   wherein, when viewed in a plan view, each position code pattern of the plurality of position code patterns is disposed between at least two adjacent pixel electrodes of the plurality of pixel electrodes and is separate from the plurality of pixel electrodes,
   wherein each position code pattern disposed between the at least two adjacent pixel electrodes of the plurality of pixel electrodes in the corresponding unit pixel is disposed at the same height with the at least two adjacent pixel electrodes relative to the substrate, and
   wherein the plurality of position code patterns are electrically floating.

4. The display device of claim 1,
   wherein the pixel-defining layer includes at least one transparent organic layer from among a photosensitive polyimide resin layer, a polyimide resin layer, a black pixel-defining layer (PDL), and a polyimide resin layer.

5. The display device of claim 1,
   wherein each position code pattern of the position code patterns has a cross shape with two lines across each other,
   wherein a portion of a line in the cross shape is disposed between two adjacent subpixels of the plurality of subpixels, and
   wherein a crossing point of the two lines in the cross shape is disposed at a region surrounded by four adjacent subpixels of the plurality of subpixels.

6. The display device of claim 1,
   wherein, when viewed in a plan view, each position code pattern of the plurality of position code patterns has at least one polygonal shape from among a rectangular shape, a square shape, and a rhombus shape or a hybrid shape obtained by combining the at least one polygonal shape.

7. The display device of claim 1,
   wherein, when viewed in a plan view, each position code pattern of the plurality of position code patterns has at least one shape from among a fan shape, a semicircular shape, and a circular shape or a hybrid shape obtained by combining the at least one shape.

8. The display device of claim 1,
   wherein, when viewed in a plan view, each position code pattern of the plurality of position code patterns surrounds at least one subpixel among the plurality of subpixels, and wherein each position code pattern of the plurality of position code patterns has at least one polygonal closed loop shape from among a rectangular closed loop shape, a rhombus closed loop shape, a hexagonal closed loop shape, and a hexagonal closed loop shape.

9. The display device of claim 1,
wherein, when viewed in a plan view, each position code pattern of the position code patterns has a mesh shape surrounding at least two adjacent subpixels of the plurality of subpixels.

10. The display device of claim 1,
wherein, when viewed in a plan view, each position code pattern of the plurality of position code patterns has an open loop shape partially surrounding a region where at least one subpixel of the plurality of subpixels is disposed, the open loop shape including a straight line or a curved line.

11. The display device of claim 1,
wherein, when viewed in a plan view, the plurality of position code patterns have different sizes, different widths in at least one direction, different lengths in at least one direction, or different areas.

12. The display device of claim 1,
wherein, when viewed in a plan view, the plurality of position code patterns include a first position code surrounding a first number of at least one subpixel of a first unit pixel among the plurality of unit pixels and a second position code surrounding a second number of at least one subpixel of a second unit pixel among the plurality of unit pixels, and
wherein the first number is different from the second number.

13. A position input system comprising:
a display device displaying an image; and
an electronic pen transmitting position coordinate data to the display device,
wherein the display device includes:
   a plurality of unit pixels on a substrate, wherein each unit pixel of the plurality of unit pixels includes a plurality of subpixels,
   a plurality of position code patterns having a predetermined position code shape, each position code pattern of the plurality of position code patterns, when viewed in a plan view, being disposed between at least two adjacent subpixels among the plurality of subpixels, and
   a pixel-defining layer covering the plurality of position code patterns and defining a region where each subpixel of the plurality of subpixels is disposed, and
wherein the plurality of position code patterns are formed in a planar code shape and are configured to reflect light incident through the pixel-defining layer,
wherein each subpixel of the plurality of subpixels includes a light-emitting element, which includes a pixel electrode, an emission layer, and a common electrode,
wherein, when viewed in a plan view, each position code pattern of the plurality of position code patterns is disposed at a corresponding unit pixel of the plurality of unit pixels and is disposed between at least two adjacent pixel electrodes of a plurality of pixel electrodes in the corresponding unit pixel,
wherein, when viewed in the plan view, each position code pattern is spaced apart from the at least two adjacent pixel electrodes in the corresponding unit pixel, and wherein the plurality of position code patterns are formed and disposed on the same layer as the plurality of pixel electrodes using the same metal material as the plurality of pixel electrodes.

14. The position input system of claim 13,
wherein, when viewed in a plan view, each position code pattern of the plurality of position code patterns is disposed between at least two adjacent pixel electrodes of the plurality of pixel electrodes and is separate from the plurality of pixel electrodes,
wherein each position code pattern disposed between the at least two adjacent pixel electrodes of the plurality of pixel electrodes in the corresponding unit pixel is disposed at the same height with the at least two adjacent pixel electrodes relative to the substrate, and
wherein the plurality of position code patterns are electrically floating.

15. The position input system of claim 13,
wherein the pixel-defining layer includes at least one transparent organic layer from among a photosensitive polyimide resin layer, a polyimide resin layer, a black pixel-defining layer (PDL), and a polyimide resin layer.

16. The position input system of claim 13,
wherein, when viewed in a plan view, each position code pattern of the plurality of position code patterns has at least one polygonal shape from among a rectangular shape, a square shape, and a rhombus shape or a hybrid shape obtained by combining the at least one polygonal shape or has at least one shape from among a fan shape, a semicircular shape, and a circular shape or a hybrid shape obtained by combining the at least one shape.

17. The position input system of claim 13,
wherein, when viewed in a plan view, each position code pattern of the plurality of position code patterns surrounds at least one subpixel among the plurality of subpixels, and each position code pattern of the plurality of position code patterns has at least one polygonal closed loop shape from among a rectangular closed loop shape, a rhombus closed loop shape, a hexagonal closed loop shape, and a hexagonal closed loop shape or has in a mesh shape surrounding at least two adjacent subpixels of the plurality of subpixels.

18. The position input system of claim 13,
wherein, when viewed in a plan view, each position code pattern of the plurality of position code patterns has an open loop shape partially surrounding a region where at least one subpixel of the plurality of subpixels is disposed, the open loop shape including a straight line or a curved line, and
wherein, when viewed in the plan view, the plurality of position code patterns have different sizes, different widths in at least one direction, different lengths in at least one direction, or different areas.

19. The position input system of claim 13,
wherein the electronic pen includes:
   a code detector configured to sense the plurality of position code patterns,
   a code processor configured to:
      receive shape data of the plurality of position code patterns,
      extract data codes corresponding to the shape of the plurality of position code patterns, and
      generate position coordinate data corresponding to the data codes, and a Bluetooth circuit configured to send the position coordinate data to the display device.

20. The display device of claim 13,
wherein, when viewed in a plan view, the plurality of position code patterns include a first position code surrounding a first number of at least one subpixel of a first unit pixel among the plurality of unit pixels and a second position code surrounding a second number of at least one subpixel of a second unit pixel among the plurality of unit pixels, and
wherein the first number is different from the second number.

* * * * *